(12) United States Patent
Lu et al.

(10) Patent No.: US 11,398,422 B2
(45) Date of Patent: Jul. 26, 2022

(54) PACKAGE STRUCTURE AND FABRICATING METHOD THEREOF

(71) Applicant: Taiwan Semiconductor Manufacturing Co., Ltd., Hsinchu (TW)

(72) Inventors: Chun-Lin Lu, Hsinchu (TW); Jiun-Yi Wu, Taoyuan County (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 37 days.

(21) Appl. No.: 16/934,024

(22) Filed: Jul. 21, 2020

(65) Prior Publication Data

US 2022/0028773 A1    Jan. 27, 2022

(51) Int. Cl.
| | |
|---|---|
| H01L 23/498 | (2006.01) |
| H01L 21/48 | (2006.01) |
| H01L 25/18 | (2006.01) |
| H01L 21/683 | (2006.01) |
| H01L 23/00 | (2006.01) |

(52) U.S. Cl.
CPC ...... *H01L 23/49833* (2013.01); *H01L 21/481* (2013.01); *H01L 21/4853* (2013.01); *H01L 21/4857* (2013.01); *H01L 21/6835* (2013.01); *H01L 23/49816* (2013.01); *H01L 23/49822* (2013.01); *H01L 23/562* (2013.01); *H01L 25/18* (2013.01); *H01L 2221/68345* (2013.01)

(58) Field of Classification Search
CPC ..... H01L 23/562; H01L 23/498–49894; H01L 23/538–5389; H01L 23/3128; H01L 21/4846–4867; H01L 21/4807–481; H01L 23/49833; H01L 21/6835; H01L 2221/68345; H01L 25/042; H01L 25/0655; H01L 25/072; H01L 25/0753; H01L 25/115; H01L 23/3121
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |

(Continued)

*Primary Examiner* — Selim U Ahmed
*Assistant Examiner* — Evan G Clinton
(74) *Attorney, Agent, or Firm* — JCIPRNET

(57) ABSTRACT

A package structure including a redistribution circuit structure, a wiring substrate, an insulating encapsulation, a buffer layer, a semiconductor device and a stiffener ring is provided. The redistribution circuit structure includes a first surface and a second surface opposite to the first surface. The wiring substrate is disposed on the first surface of the redistribution circuit structure. The insulating encapsulation is disposed on the first surface of the redistribution circuit structure and laterally encapsulating the wiring substrate. The buffer layer is disposed over the second surface of the redistribution circuit structure. The semiconductor device is disposed on the buffer layer, and the semiconductor device is electrically connected to the wiring substrate through the redistribution circuit structure. The stiffener ring is adhered with the buffer layer by an adhesive.

20 Claims, 35 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2019/0051621 A1* | 2/2019 | Liu ............... H01L 21/4853 |
| 2019/0393051 A1* | 12/2019 | Kawano ............. H01L 23/60 |
| 2020/0194393 A1* | 6/2020 | Wu ................ H01L 21/6835 |
| 2020/0273812 A1* | 8/2020 | Lin ............... H01L 25/0655 |

* cited by examiner

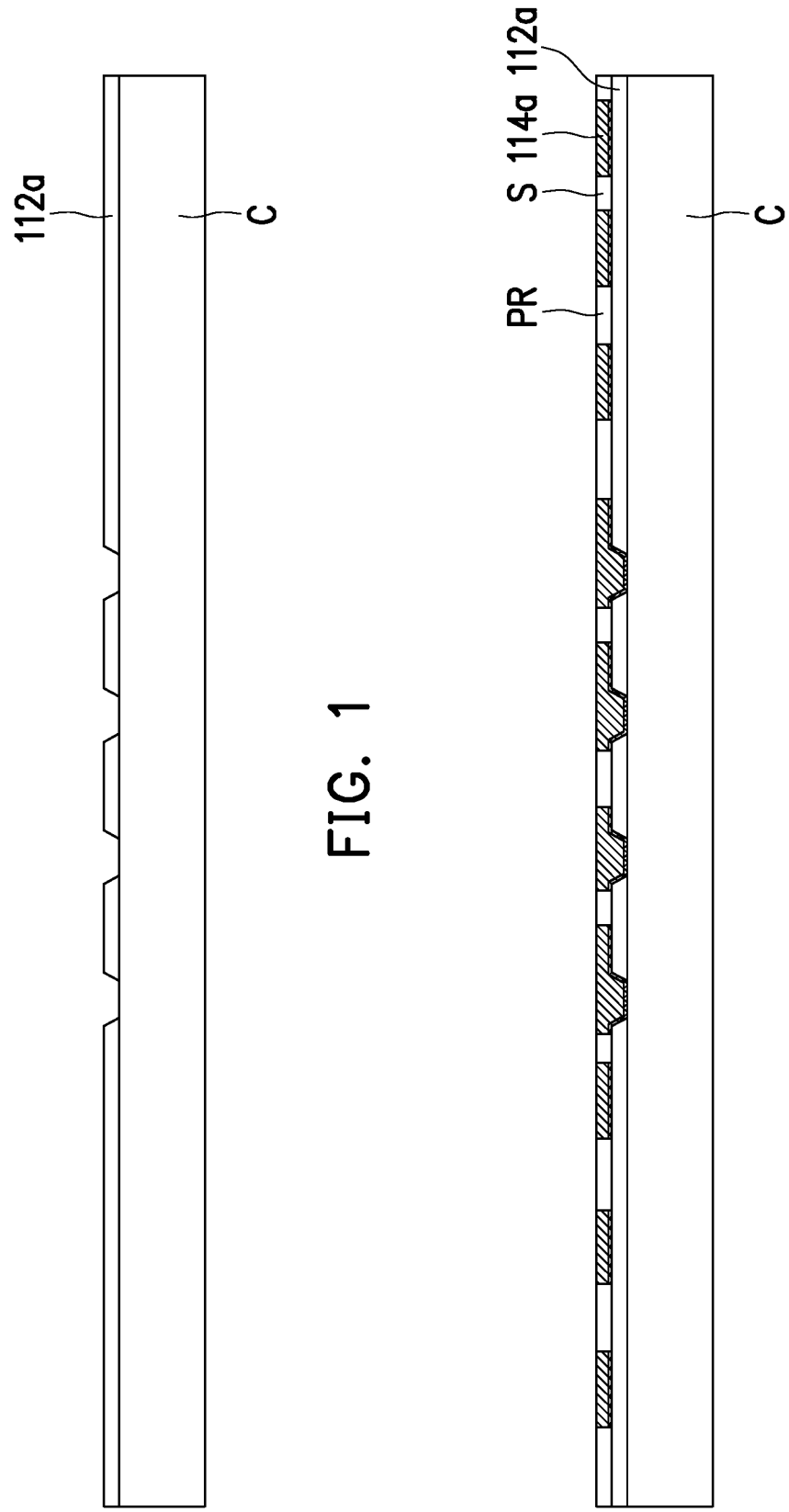

PACKAGE STRUCTURE AND FABRICATING METHOD THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for warpage control techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 9 are cross-sectional views schematically illustrating a process flow for fabricating a package structure in accordance with the first embodiment of the present disclosure.

DETAILED DESCRIPTION

Figure 3:
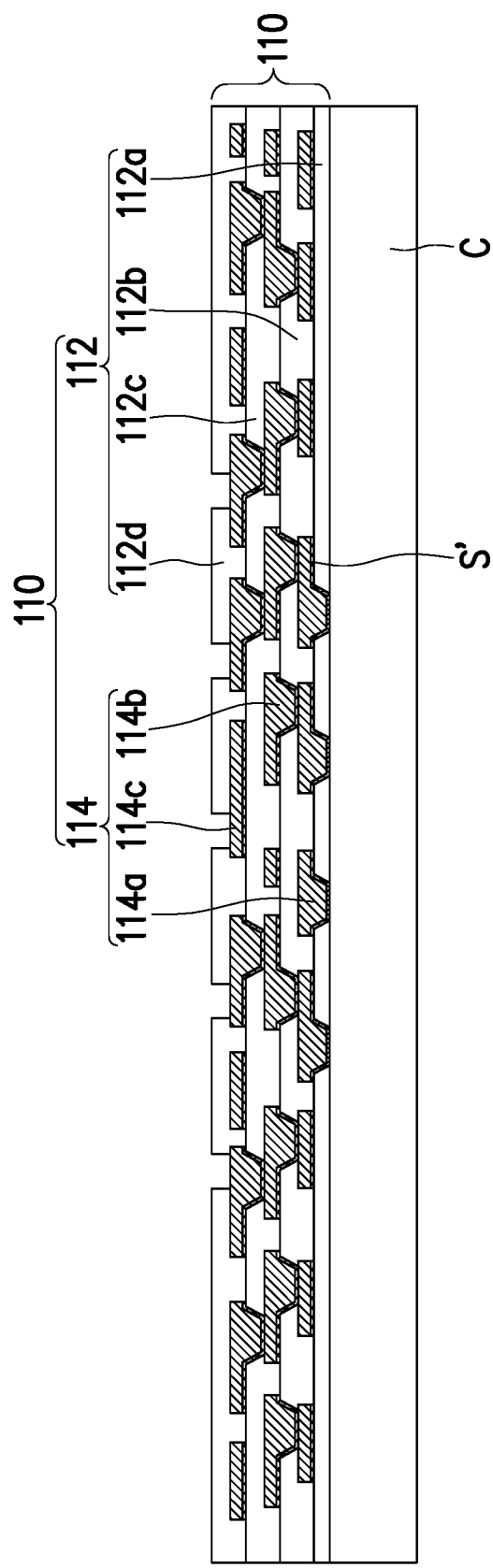

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 9 are cross-sectional views schematically illustrating a process flow for fabricating a package structure in accordance with the first embodiment of the present disclosure.

Referring to FIG. 1 through FIG. 3, a carrier C is provided and a redistribution circuit structure 110 is formed over the carrier C. In some embodiments, the wafer form redistribution circuit structure 110 is formed over a wafer form carrier C. The redistribution circuit structure 110 may include stacked dielectric layers 112 and redistribution wirings 114 between the stacked dielectric layers 112. The stacked dielectric layers 112 are stacked over the carrier C. The redistribution wirings 114 are embedded in the stacked dielectric layers 112 carried by the carrier C.

As illustrated in FIG. 1, a first dielectric layer 112a is formed over the carrier C. The first dielectric layer 112a may include openings and portions of the carrier C are revealed by the openings defined in the first dielectric layer 112a. In some embodiments, the material of the first dielectric layer 112a includes polybenzoxazole (PBO), polyimide (PI) or other suitable polymer dielectric material. In some alternative embodiments, the material of the dielectric layer 112a includes resin mixed with filler. The first dielectric layer 112a may be formed by photo-patternable material and patterned by a photolithography process.

As illustrated in FIG. 2, a seed layer S is formed over the carrier C to cover the first dielectric layer 112a and the portions of the carriers C which are revealed by the openings defined in the first dielectric layer 112a. The seed layer S may be sputter Ti/Cu seed layer which entirely covers the first dielectric layer 112a. After forming the seed layer S, a patterned photoresist layer PR is formed on the seed layer S. The patterned photoresist layer PR includes trenches, and portions of the seed layer S are revealed by the trenches defined in the patterned photoresist layer PR. After the patterned photoresist layer PR is formed on the seed layer S, a plating process may be performed by using the patterned photoresist layer PR as a mask such that first conductive wirings 114a are plated in the trench and cover the revealed portions of the seed layer S.

After forming the first conductive wirings 114a, the patterned photoresist layer PR is removed such that portions of the seed layer S that are not covered by the first conductive wirings 114a are revealed, and a patterned seed layer S' is formed under the first conductive wirings 114a. An etching process may be performed to remove the portions of the seed layer S that are not covered by the first conductive wirings 114a until portions of the first dielectric layer 112a are revealed. As illustrated in FIG. 2, the first conductive wirings 114a and the patterned seed layer S' may be considered as a layer of redistribution wirings.

As illustrated in FIG. 3, after the first dielectric layer 112a and the first conductive wirings 114a are formed, a second dielectric layer 112b, second conductive wirings 114b, a third dielectric layer 112c, third conductive wirings 114c and a fourth dielectric layer 112d may be formed over the carrier C such that the redistribution circuit structure 110 is formed. The fabrication process of the second dielectric layer 112b, the third dielectric layer 112c and the fourth dielectric layer 112d may be similar to that of the first dielectric layer 112a. The fabrication process of the second conductive wirings 114b and the third conductive wirings 114c may be similar to that of the first conductive wirings 114a. The number of dielectric layers 112 and redistribution wirings 114 in the redistribution circuit structure 110 may be modified in accordance with design rule of products.

The redistribution wirings 114 may include conductive wirings and conductive vias electrically connected between conductive wirings, wherein the conductive wirings may transmit signal horizontally, and the conductive vias may transmit signal vertically. The material of the redistribution wirings 114 may include copper or other suitable metallic materials.

Figure 4:
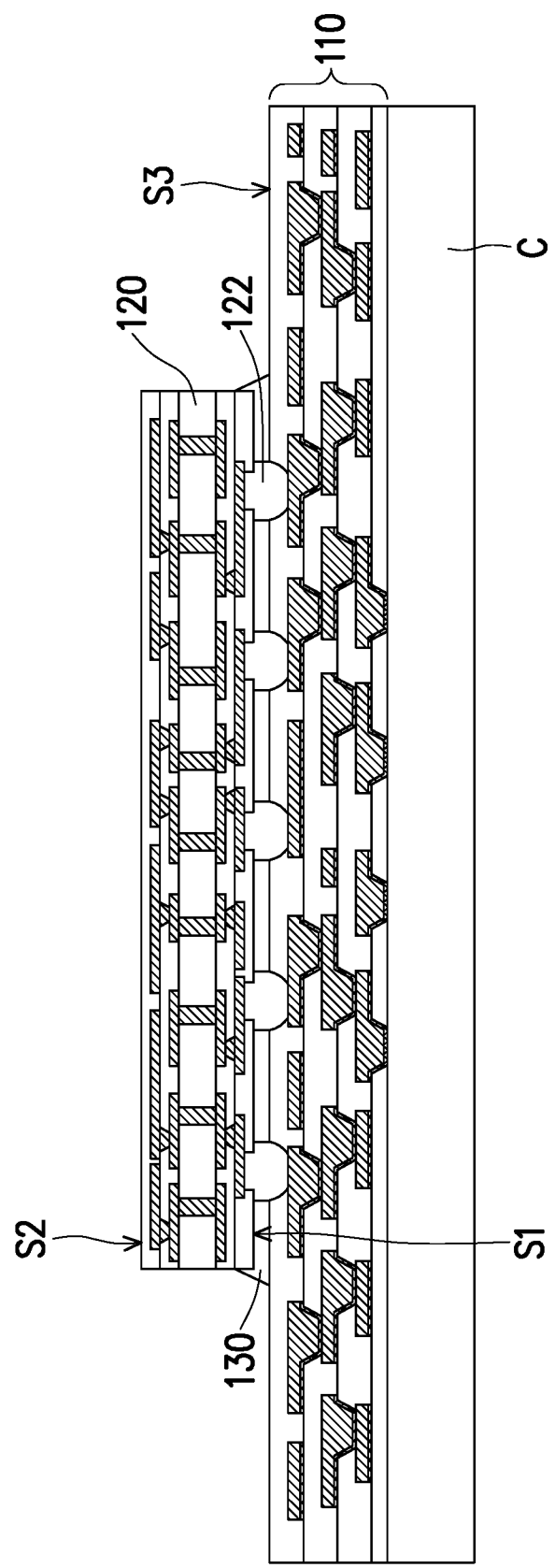

Referring to FIG. 4, at least one wiring substrate 120 is provided over a surface S3 of the redistribution circuit structure 110 carried by the carried C. The wiring substrate 120 may include conductive terminals 122 formed thereon. In some embodiments, the wiring substrate 120 includes a first surface S1 (e.g., a bottom surface) and a second surface S2 (e.g., a top surface) opposite to the first surface S1, and the conductive terminals 122 are arranged in array and distributed on the first surface S1 of the wiring substrate 120. The conductive terminals 122 may include solder posts or solder bumps arranged in array. The wiring substrate 120 may be placed onto the surface S3 of the redistribution circuit structure 110 such that the first surface S1 of the wiring substrate 120 faces the redistribution circuit structure 110. A reflow process is performed such that the wiring substrate 120 can be electrically connected to the redistribution wirings 114 of the redistribution circuit structure 110 through the conductive terminals 122. After the wiring substrate 120 is mounted on the redistribution circuit structure 110 carried by the carrier C, a space is defined between the wiring substrate 120 and the surface S3 of the redistribution circuit structure 110. In other words, the first surfaces S1 of the wiring substrate 120 is separated from the redistribution circuit structure 110 by a predetermined distance. For example, the predetermined distance between the first surfaces S1 of the wiring substrate 120 and the surface S3 of the redistribution circuit structure 110 ranges from about 50 micrometers to about 100 micrometers.

As illustrated in FIG. 4, an underfill 130 is formed over the redistribution circuit structure 110 to fill the space between the redistribution circuit structure 110 and the wiring substrate 120 and laterally encapsulate the conductive terminals 122 such that reliability of the conductive terminals 122 may be enhanced. The underfill 130 may partially cover sidewalls of the wiring substrate 120. In some alternative embodiments, formation of the underfill 130 may be omitted. The material of the underfill 130 may be an insulating material and include a resin (e.g., epoxy resin), a filler material, a stress release agent (SRA), an adhesion promoter, other material, or a combination thereof.

Figure 5:
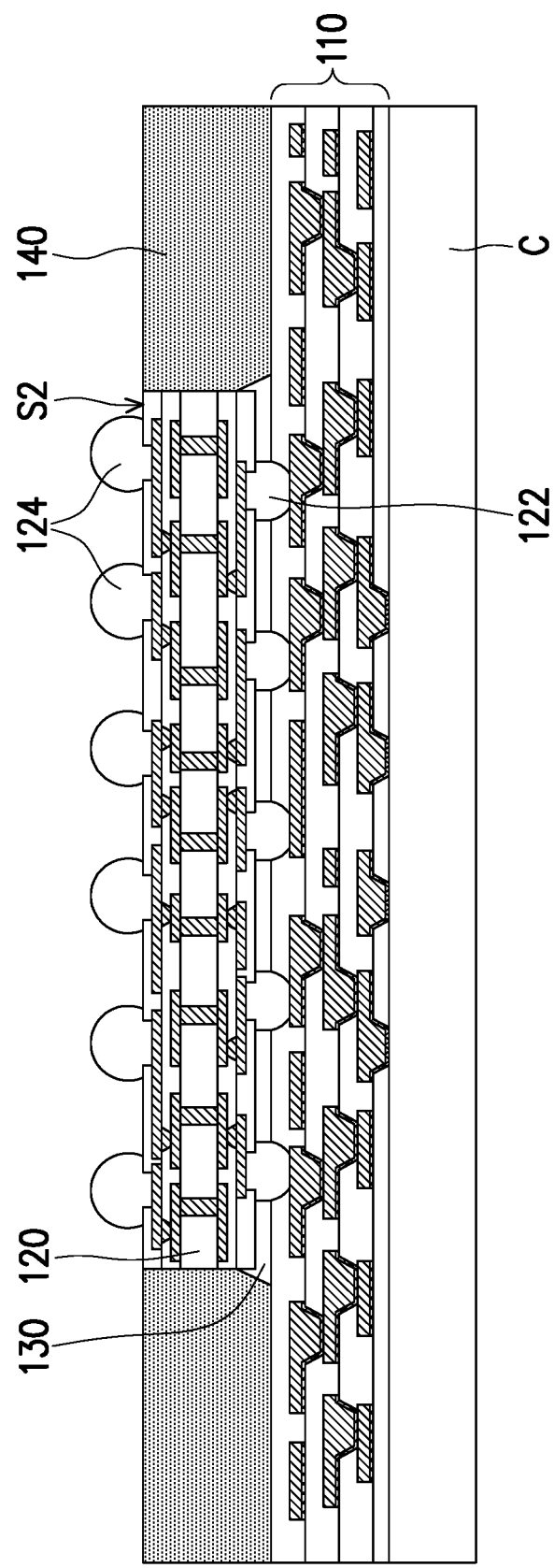

Referring to FIG. 5, an insulating encapsulation 140 is formed on the redistribution circuit structure 110 to laterally encapsulate the wiring substrate 120 and the underfill 130. In some embodiments, an over-mold process is performed to form an encapsulation material over the redistribution circuit structure 110 such that the wiring substrate 120 and the underfill 130 are covered by the encapsulation material. The material of the insulating encapsulation 140 may include molding compound or molded underfill (MUF). In some embodiments, the material of the insulating encapsulation 140 may include epoxy resins, phenolic hardeners, silicas, catalysts, pigments, mold release agents and so on. After forming the encapsulation material, a removal process is performed to partially remove a portion of the encapsulation material until the second surface S2 of the wiring substrate 120 is revealed. After performing the removal process of the encapsulation material, the insulating encapsulation 140 is formed, wherein the second surface S2 of the wiring substrate 120 may be substantially leveled with, slightly lower than or slightly higher than a surface 142 of the insulating encapsulation 140. The above-mentioned removal process of the encapsulation material may be chemical mechanical polishing (CMP) process, mechanical grinding process or other suitable removal process.

After forming the insulating encapsulation 140, an uppermost dielectric layer of the wiring substrate 120 is patterned such that conductive wirings in the wiring substrate 120 are revealed. Then, conductive terminals 124 are formed on the second surface S2 of the wiring substrate 120, wherein the conductive terminals 124 are electrically connected to the revealed conductive wirings in the wiring substrate 120. The dimension of the conductive terminals 124 may be greater than that of the conductive terminals 122. In some embodiments, the conductive terminals 124 includes ball-grid array (BGA) balls.

Figure 6:
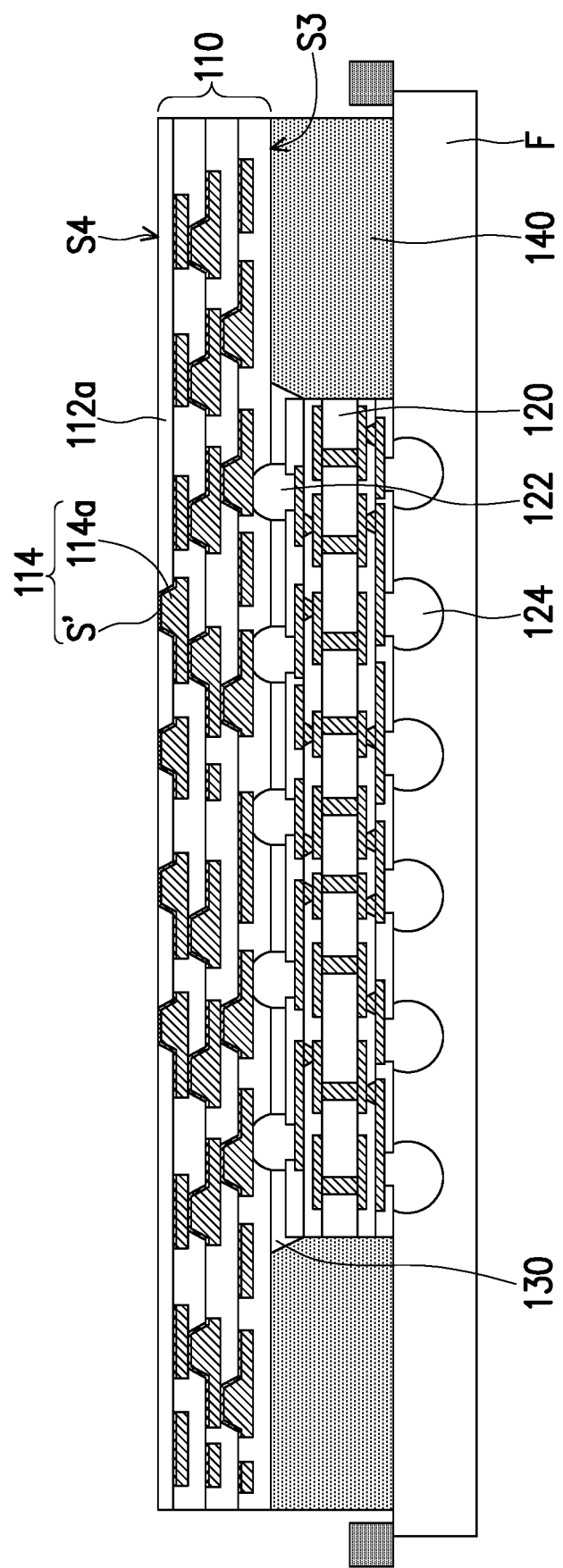

Referring to FIG. 5 and FIG. 6, after forming the conductive terminals 124, a de-bonding process is performed such that a resulted structure including the redistribution circuit structure 110, the wiring substrate 120, the conductive terminals 122, the conductive terminals 124, the underfill 130 and the insulating encapsulation 140 can be de-bonded from the carrier C. After performing the de-bonding process, a frame mount process is performed to mount the resulted structure on a frame F. The resulted structure de-bonded from the carrier C is flipped upside down and mounted onto the frame F such that a surface S4 of the redistribution circuit structure 110 is revealed, wherein the surface S4 of the redistribution circuit structure 110 is opposite to the surface S3 of the redistribution circuit structure 110.

As illustrated in FIG. 6, after performing the de-bonding process, the uppermost redistribution wirings 114 including the first conductive wirings 114a and the patterned seed layer S' are partially revealed from the surface S4 of the redistribution circuit structure 110. In other words, portions of the patterned seed layer S' are revealed from the surface S4 of the redistribution circuit structure 110. Furthermore, the first dielectric layer 112a is revealed after performing the de-bonding process. In the present embodiments, the thickness of the outermost dielectric layer 112a of the redistribution circuit structure 110 is greater than 7 micrometers such that the first dielectric layer 112a can provide sufficient barrier and/or buffering function.

Figure 7:
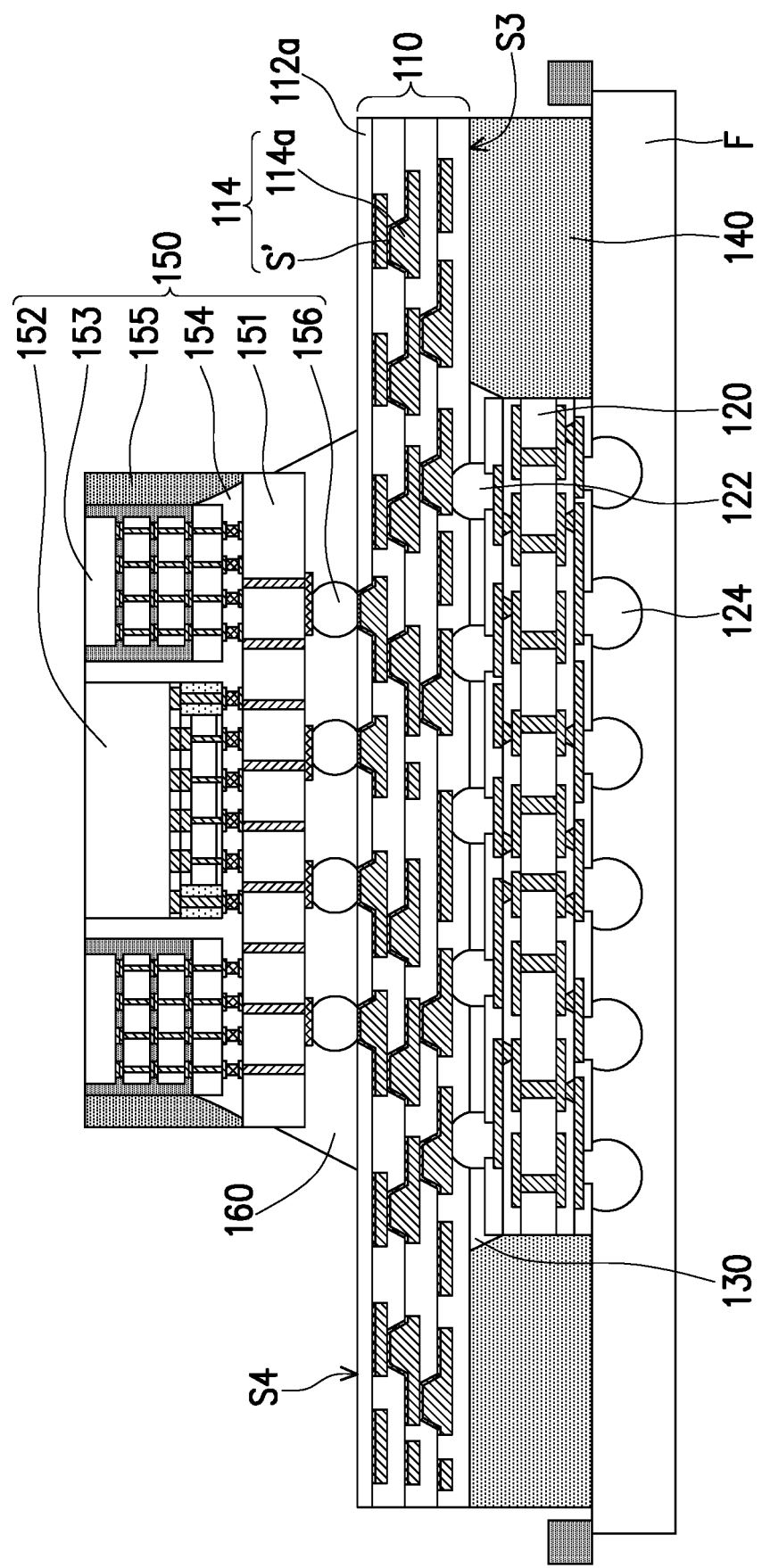

Referring to FIG. 7, at least one semiconductor device 150 is provided and disposed on the surface S4 of the redistribution circuit structure 110, wherein the at least one semiconductor device 150 is electrically connected to the wiring substrate 120 through the redistribution circuit structure 110.

The at least one semiconductor device 150 is provided and mounted on the redistribution circuit structure 110 through a chip-to-wafer bonding process, for example, such that the at least one semiconductor device 150 is electrically connected to the outermost redistribution wirings 114a of the redistribution circuit structure 110. In some embodiments, the at least one semiconductor device 150 may be a chip package including an interposer 151, a semiconductor die 152, memory cubes 153, an underfill 154, an insulating encapsulation 155, and conductive terminals 156. The semiconductor die 152 and the memory cubes 153 may be disposed on the top surface of the interposer 151. The semiconductor die 152 and the memory cubes 153 may be electrically connected to the interposer 151 through conductive bumps (e.g., micro-bumps). The underfill may 154 fill the space between the interposer 151 and the semiconductor die 152 as well as the space between the interposer 151 and the memory cubes 153. The insulating encapsulation 155 encapsulates the semiconductor die 152, the memory cubes 153 and the underfill 154. The conductive terminals 156 are disposed on the bottom surface of the interposer 151.

The interposer 151 may be a semiconductor interposer (e.g., a silicon interposer) including through semiconductor vias (e.g. through silicon vias). The semiconductor die 152 may be logic die, a system on chip (SOC) die or other suitable semiconductor die. In some embodiments, the semiconductor die 152 may be an system on integrated circuit (SoIC) structure including multiple hybrid bonded and stacked semiconductor chips, wherein the semiconductor chips may be different in width. The semiconductor die 152 may include a first chip, a second chip and an insulating encapsulation, wherein the first chip is encapsulated by the insulating encapsulation and hybrid bonded with the second chip. The memory cubes 153 may include high bandwidth memory (HBM) cubes or other suitable memory device. The material of the underfill 154 is an insulating material and may include a resin (e.g., epoxy resin), a filler material, a stress release agent (SRA), an adhesion promoter, other material, or a combination thereof. The material of the insulating encapsulation 155 may include molding compound or molded underfill (MUF). In some embodiments, the material of the insulating encapsulation 155 may include epoxy resins, phenolic hardeners, silicas, catalysts, pigments, mold release agents and so on. The conductive terminals 156 may include controlled collapse chip connection (C4) bumps.

As illustrated in FIG. 7, after the at least one semiconductor device 150 is mounted on the redistribution circuit structure 110 through the conductive terminals 156, an underfill 160 may be formed on the surface S4 of the redistribution circuit structure 110 so as to fill a space between the at least one semiconductor device 150 and the redistribution circuit structure 110. In addition, the underfill 160 may further cover sidewalls of the at least one semiconductor device 150. The material of the underfill 160 is an insulating material and may include a resin (e.g., epoxy resin), a filler material, a stress release agent (SRA), an adhesion promoter, other material, or a combination thereof.

Figure 8:
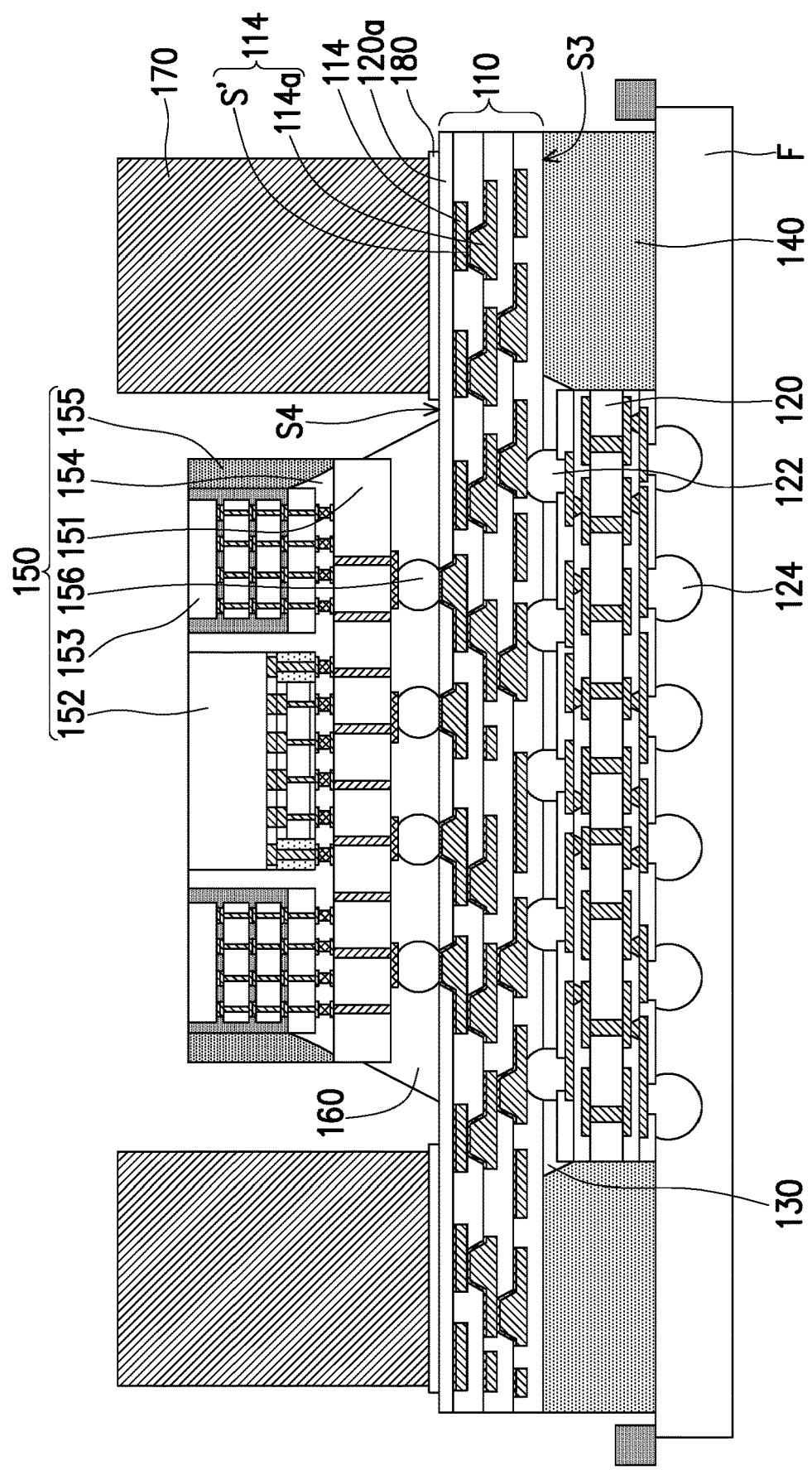

Referring to FIG. 7 and FIG. 8, after the at least one semiconductor device 150 is mounted on and bonded with the redistribution circuit structure 110, a stiffener ring 170 is provided and adhered with the surface S4 of the redistribution circuit structure 110 by an adhesive 180. The stiffener ring 170 is adhered with the first dielectric layer 112a of the redistribution circuit structure 110 by the adhesive 180. The stiffener ring 170 may minimize warpage of the resulted structure illustrated in FIG. 7. In some embodiments, the stiffener ring 170 is copper ring, stainless ring or other metallic ring, and the adhesive 180 includes organic adhesive material. The first dielectric layer 112a having thickness greater than 7 micrometers may prevent chemical diffusion from the adhesive 180. The chemical diffusion from the adhesive 180 may be blocked by the first dielectric layer 112a having sufficient thickness. Furthermore, an interface between the first dielectric layer 112a and the first conductive wirings 114a may not be damage by the chemical diffusion from the adhesive 180. Accordingly, delamination issue may not occur at the interface between the first dielectric layer 112a and the first conductive wirings 114a, and reliability of the redistribution circuit structure 110 may be improved.

Figure 9:
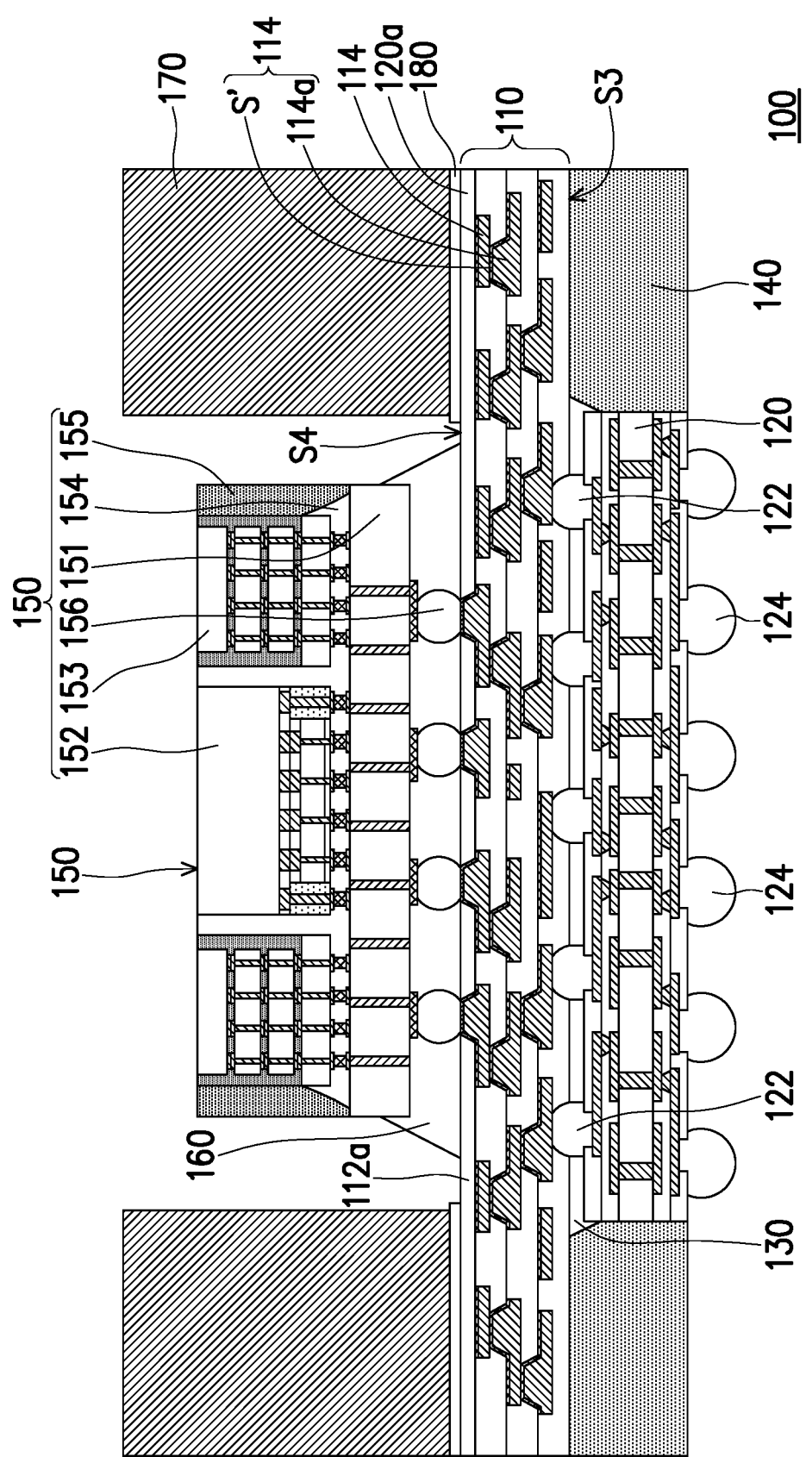

Referring to FIG. 8 and FIG. 9, a singulation process is performed to singulate the resulted structure illustrated in FIG. 8 such that package structure 100 is obtained. The package structure P includes a redistribution circuit structure 110, a wiring substrate 120, an insulating encapsulation 130, a semiconductor device 150 and a stiffener ring 170 is provided. The redistribution circuit structure 110 includes a first surface S3 and a second surface S4 opposite to the first surface S3. The wiring substrate 120 is disposed on the first surface S3 of the redistribution circuit structure 110. The insulating encapsulation 140 is disposed on the first surface S3 of the redistribution circuit structure 110 and laterally encapsulating the wiring substrate 120. The semiconductor device 150 is disposed on the second surface S4 of the redistribution circuit structure 110, and the semiconductor device 150 is electrically connected to the wiring substrate 120 through the redistribution circuit structure 110. The stiffener ring 170 is adhered with the second surface S4 of the redistribution circuit structure 110 by an adhesive 180, wherein the stiffener ring 170 is adhered with an outermost dielectric layer 112a of the redistribution circuit structure 110 by the adhesive 180 and a thickness of the outermost dielectric layer 112a of the redistribution circuit structure 110 is greater than 7 micrometers.

In some embodiments, the package structure 100 may further include first conductive terminals 156 and a first underfill 160, wherein the first conductive terminals 156 are disposed between the redistribution circuit structure 110 and the semiconductor device 150, the redistribution circuit structure 110 is electrically connected to the semiconductor device 150 through the first conductive terminals 156, the first underfill 160 is disposed between the redistribution circuit structure 110 and the semiconductor device 150, and the first underfill 160 laterally encapsulates the first conductive terminals 156.

In some embodiments, the package structure 100 may further include second conductive terminals 122 and a second underfill 130, wherein the second conductive terminals 122 are disposed between the redistribution circuit structure 110 and the wiring substrate 120, the redistribution circuit structure 110 is electrically connected to the wiring substrate 120 through the second conductive terminals 122, the second underfill 130 is disposed between the redistribution circuit structure 110 and the wiring substrate 120, and the second underfill 130 laterally encapsulates the second conductive terminals 122.

Figure 10:
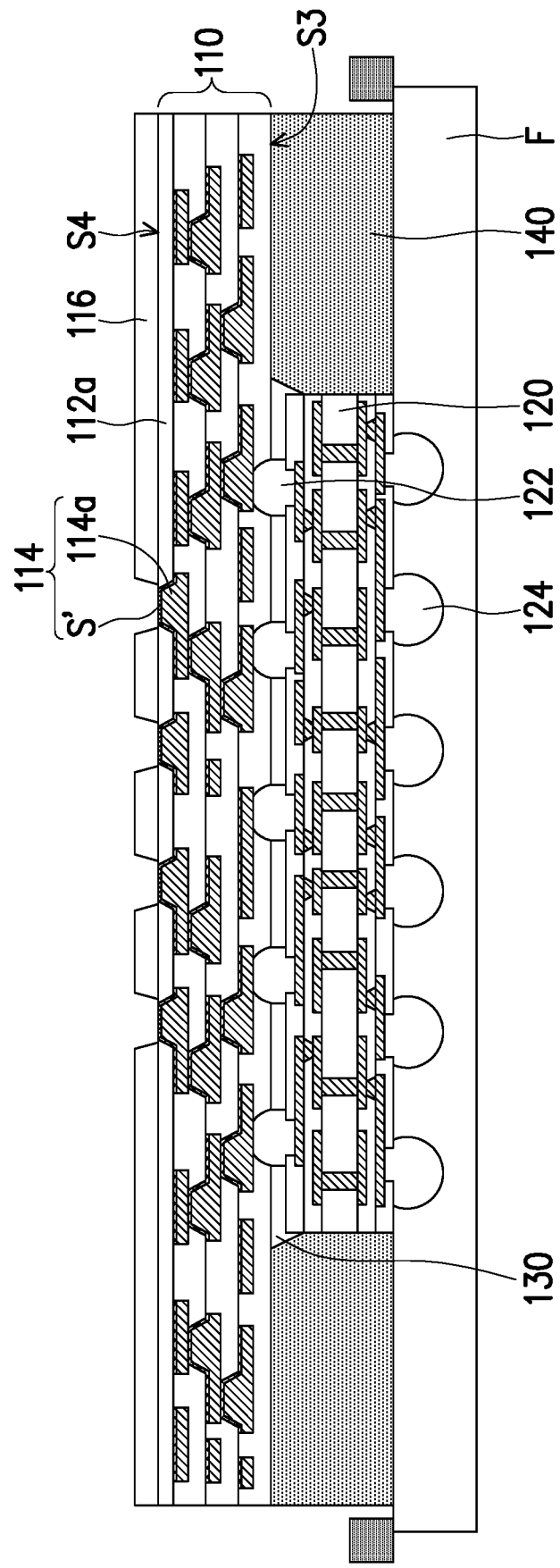
FIG. 10 through FIG. 13 are cross-sectional views schematically illustrating a process flow for fabricating a package structure in accordance with the second embodiment of the present disclosure.
Figure 11:
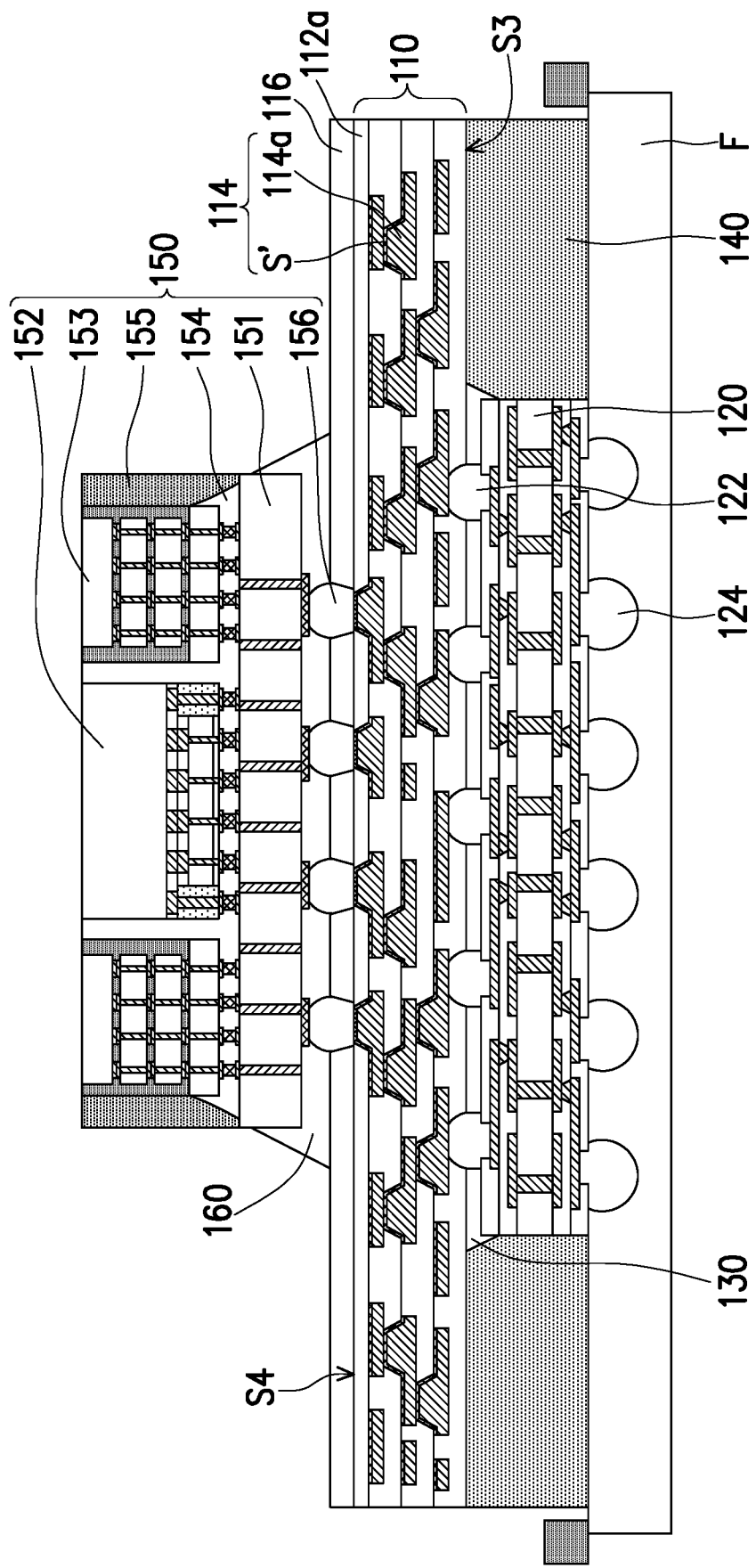
Figure 12:
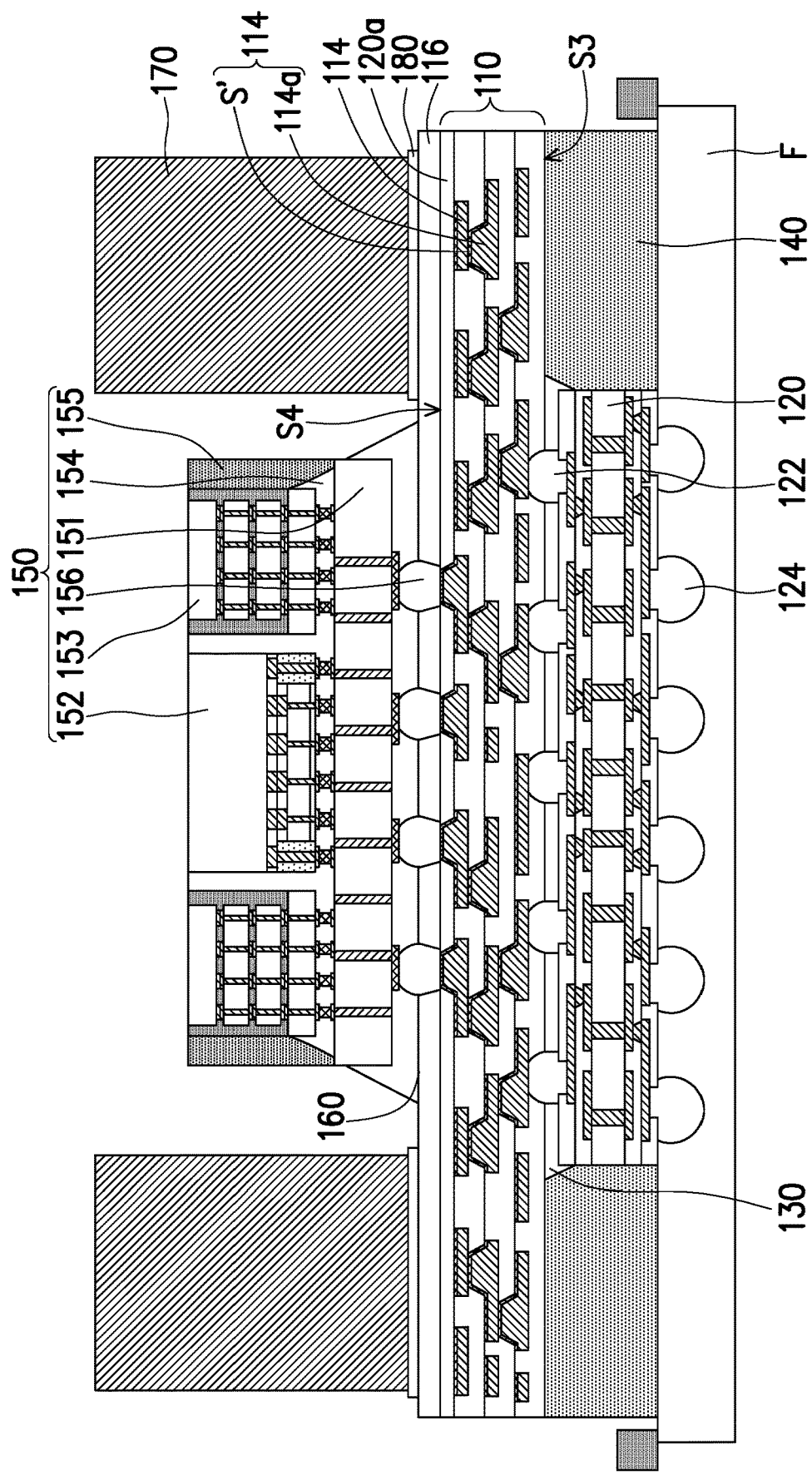
Figure 13:
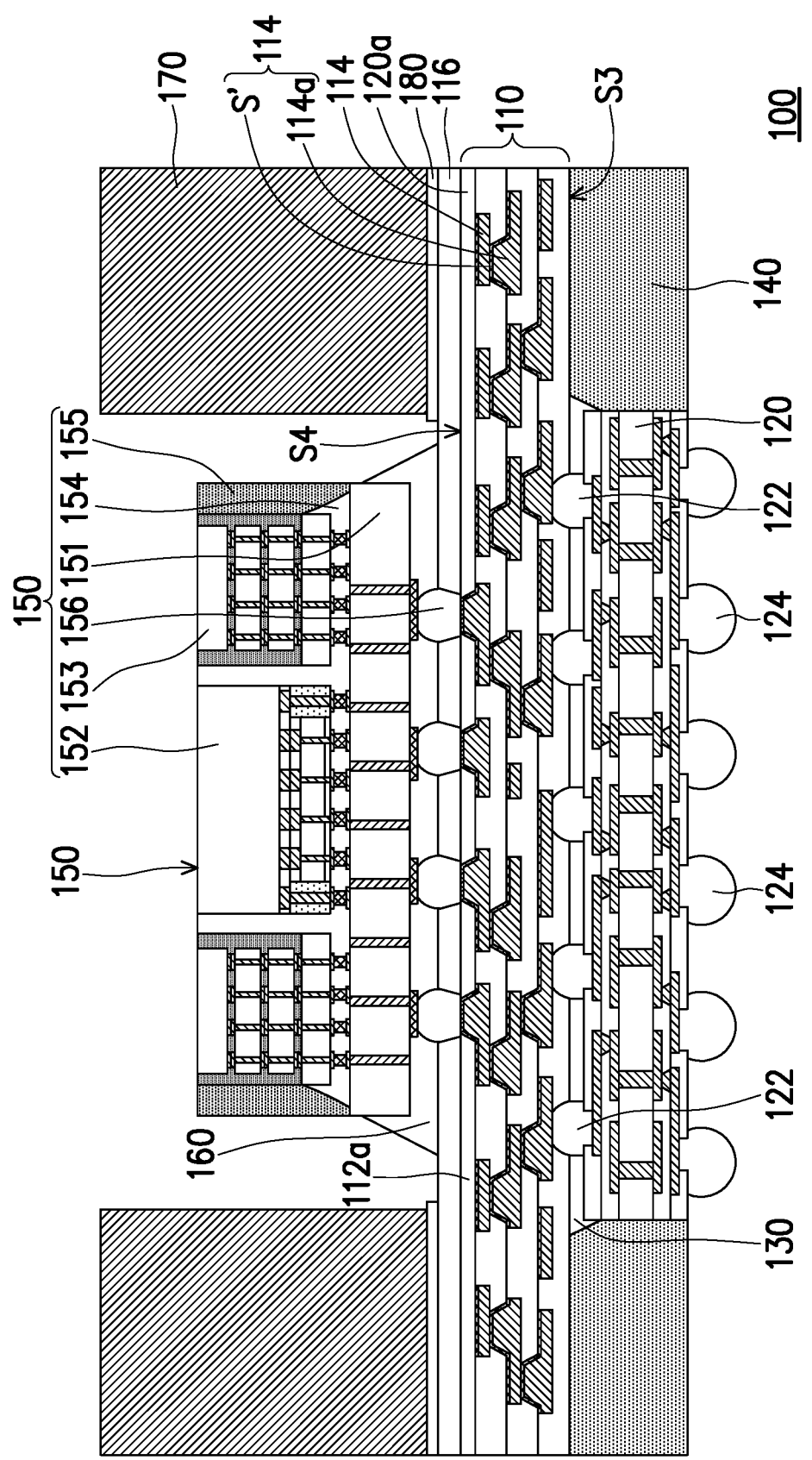

FIG. 10 through FIG. 13 are cross-sectional views schematically illustrating a process flow for fabricating a package structure in accordance with the second embodiment of the present disclosure. Processes illustrated in FIG. 10 through FIG. 13 are performed after the processes illustrated in FIG. 1 through FIG. 6. Processes illustrated in FIG. 11 through FIG. 13 are similar to those illustrated in FIG. 7 through FIG. 9, and descriptions regarding to the processes illustrated in FIG. 11 through FIG. 13 are thus omitted.

Referring to FIG. 6 and FIG. 10, after performing the de-bonding process and the frame mount process illustrated in FIG. 6, a buffer layer 116 is formed over the outermost dielectric layer 112a of the redistribution circuit structure 110. In some embodiments, the material of the buffer layer 116 includes copper paste, silver paste, polymer and so on. The thickness of the outermost dielectric layer 112a may range from about 5 micrometers to about 10 micrometers, and the thickness of the buffer layer 116 may range from about 20 micrometers to about 50 micrometers. The sum of the thickness of the outermost dielectric layer 112a and the buffer layer 116 may be greater than 30 micrometers. For example, the sum of the thickness of the outermost dielectric layer 112a and the buffer layer 116 may range from about 20 micrometers to about 60 micrometers. In the present embodiments, the outermost dielectric layer 112a and the buffer layer 116 can provide sufficient barrier and/or buffering function. The outermost dielectric layer 112a and the buffer layer 116 may prevent chemical diffusion from the adhesive 180. The chemical diffusion from the adhesive 180 may be blocked by the outermost dielectric layer 112a and the buffer layer 116. Furthermore, an interface between the first dielectric layer 112a and the first conductive wirings 114a may not be damage by the chemical diffusion from the adhesive 180. Accordingly, delamination issue may not occur at the interface between the first dielectric layer 112a and the first conductive wirings 114a, and reliability of the redistribution circuit structure 110 may be improved.

Figure 14:
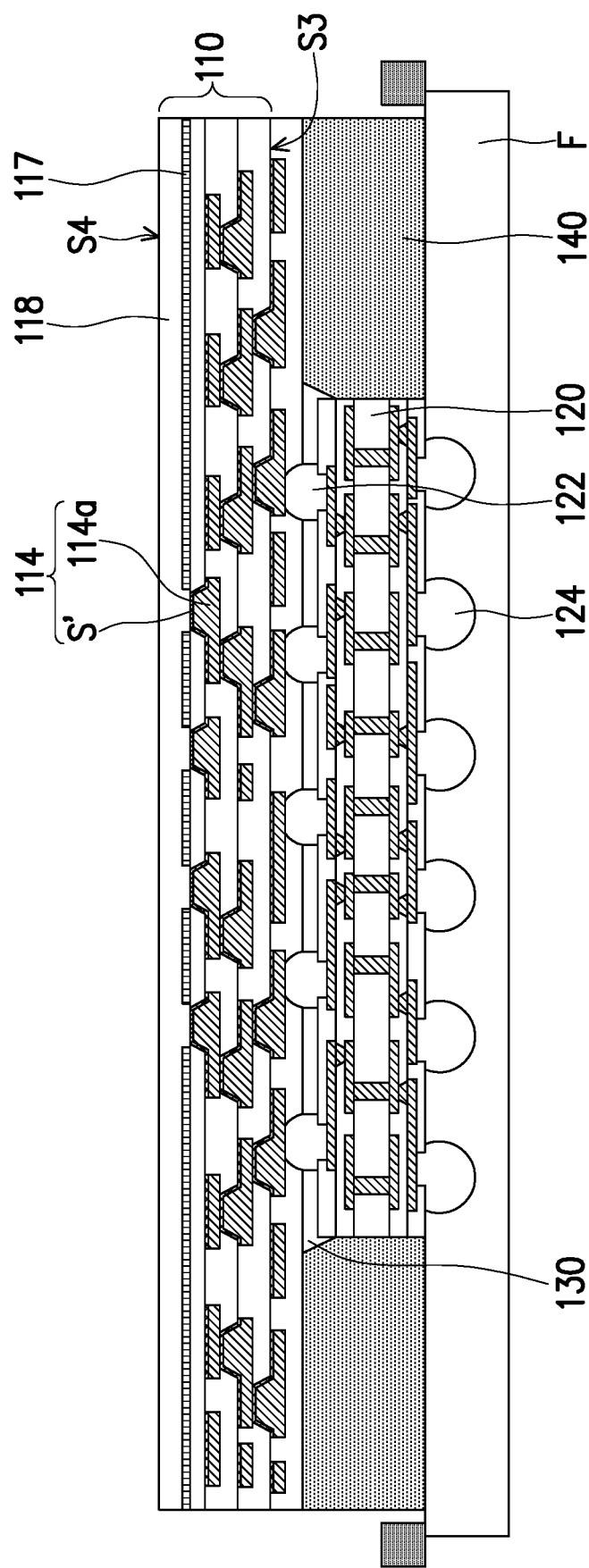
FIG. 14 through FIG. 18 are cross-sectional views schematically illustrating a process flow for fabricating a package structure in accordance with the third embodiment of the present disclosure.
Figure 15:
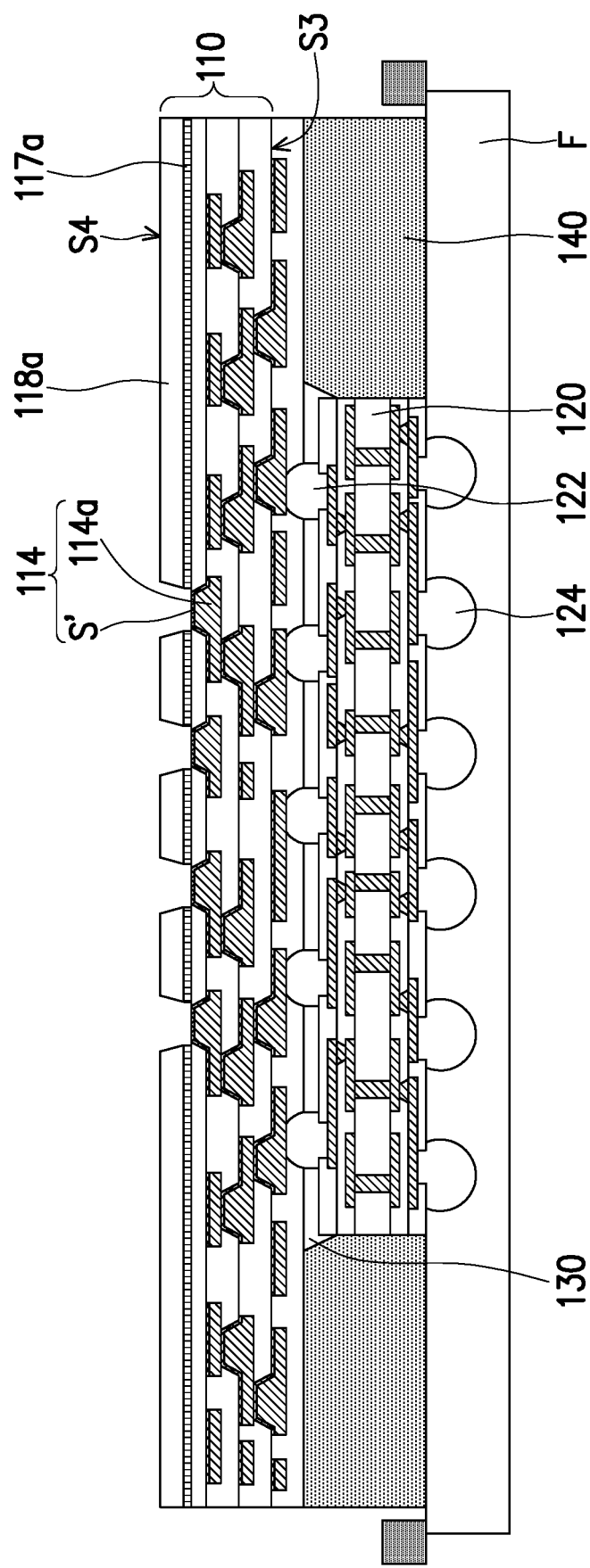
Figure 16:
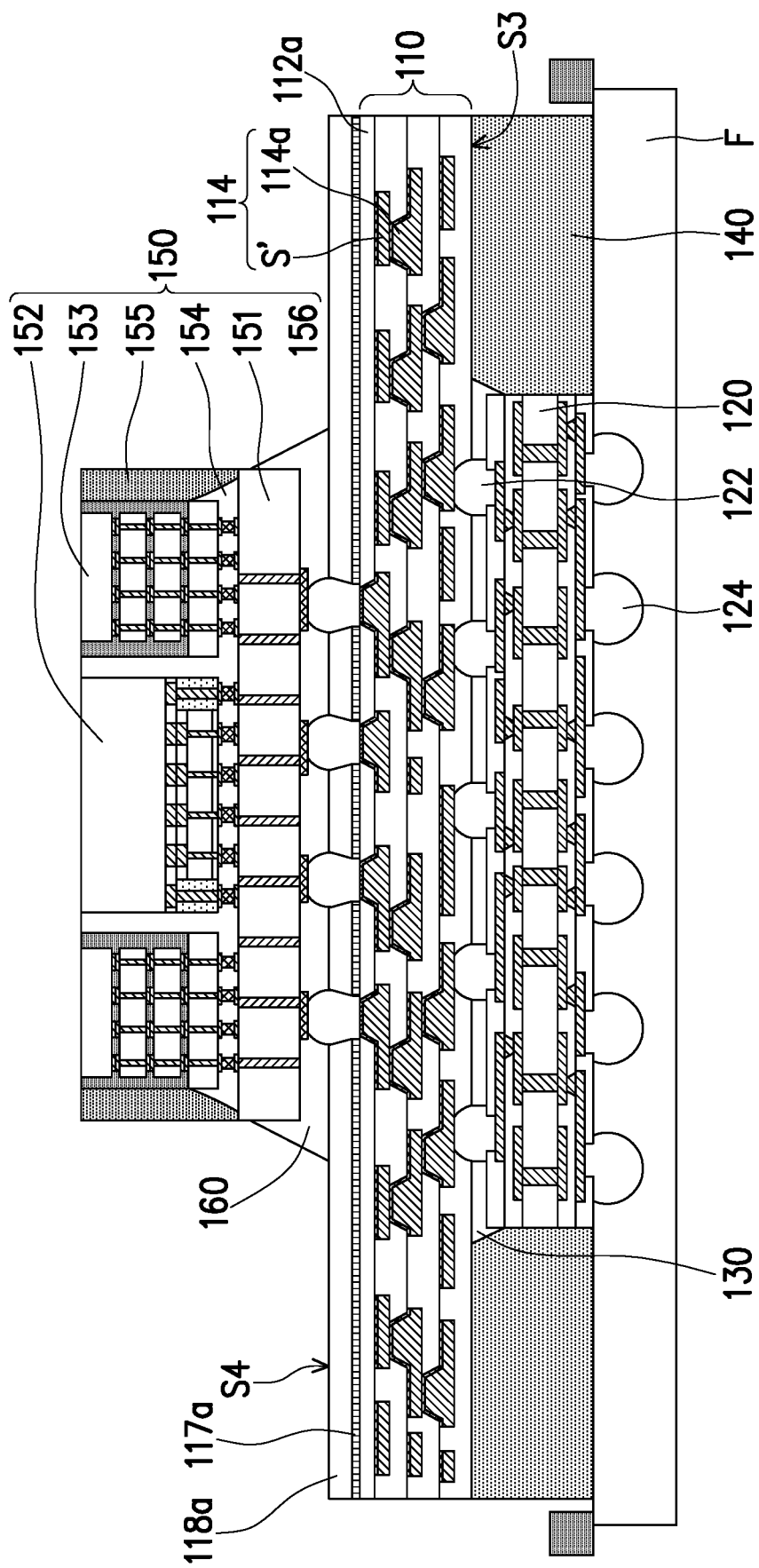
Figure 17:
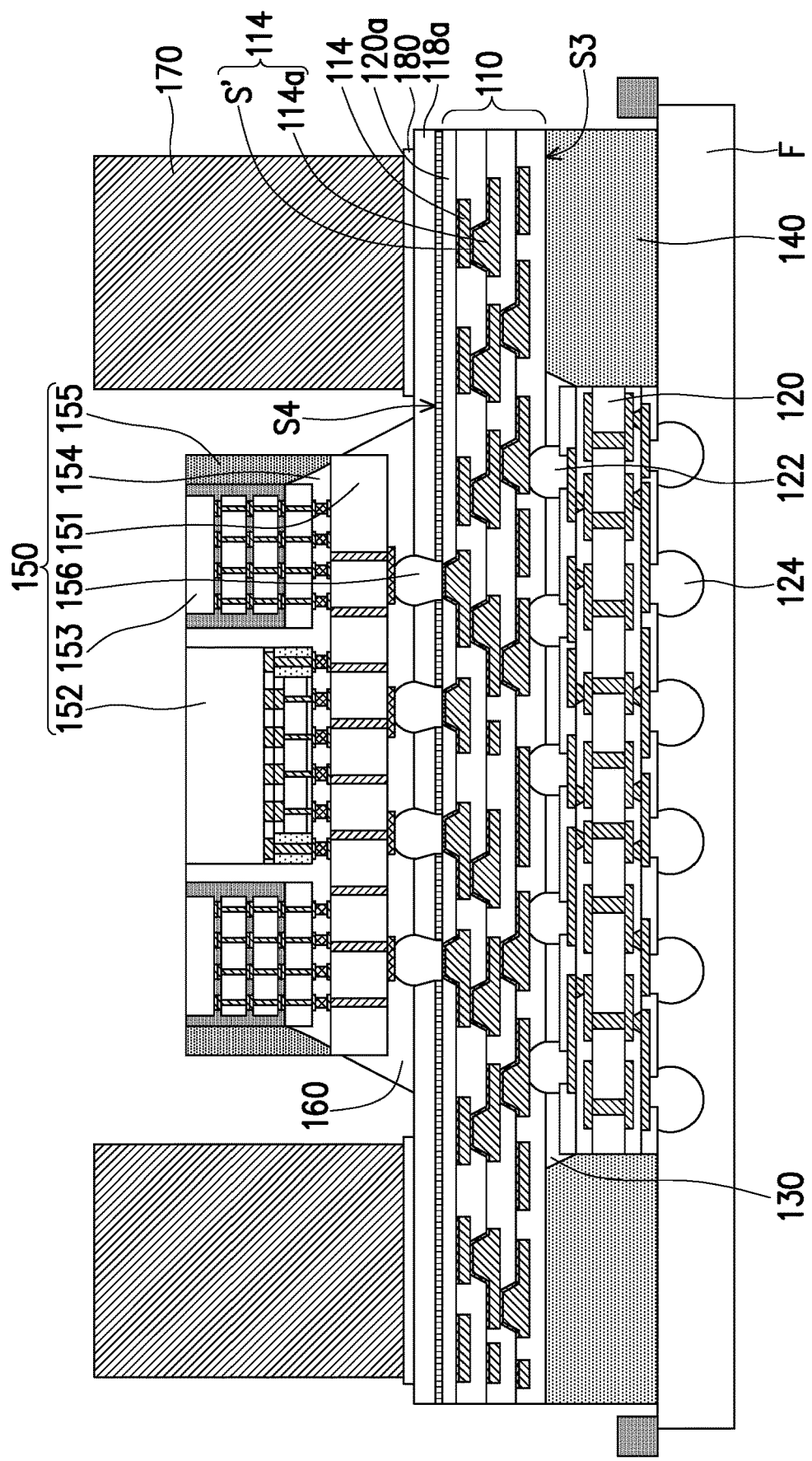
Figure 18:
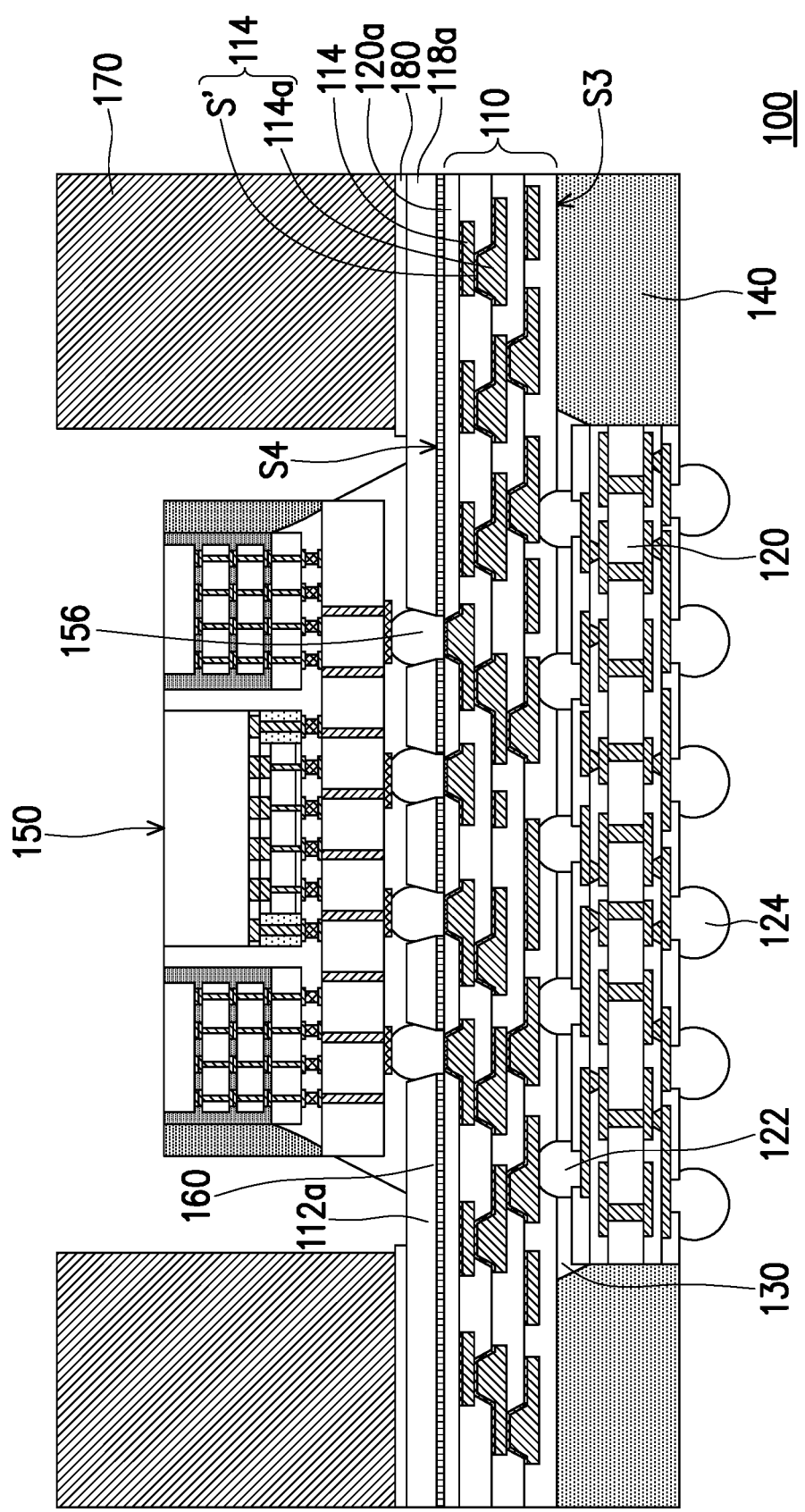
Figure 19:
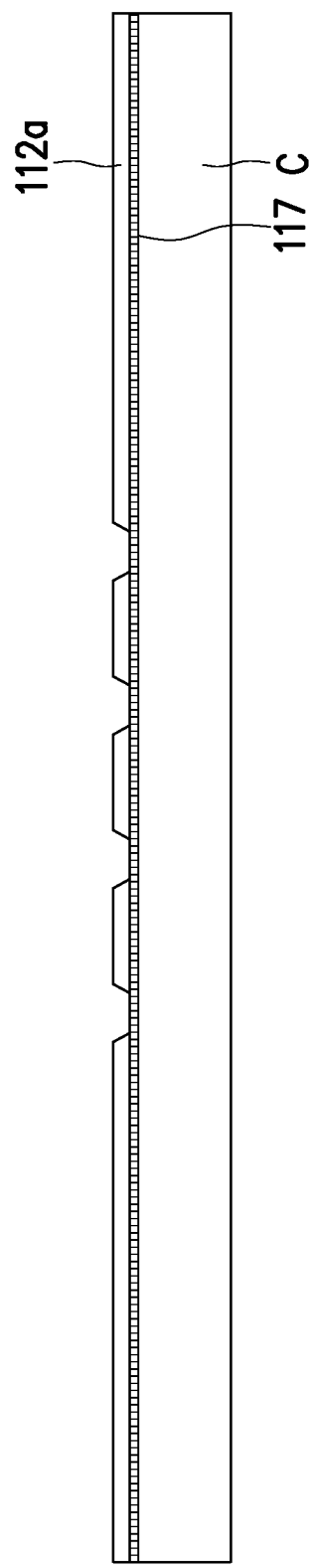
FIG. 19 through FIG. 27 are cross-sectional views schematically illustrating a process flow for fabricating a package structure in accordance with the fourth embodiments of the present disclosure.
Figure 20:
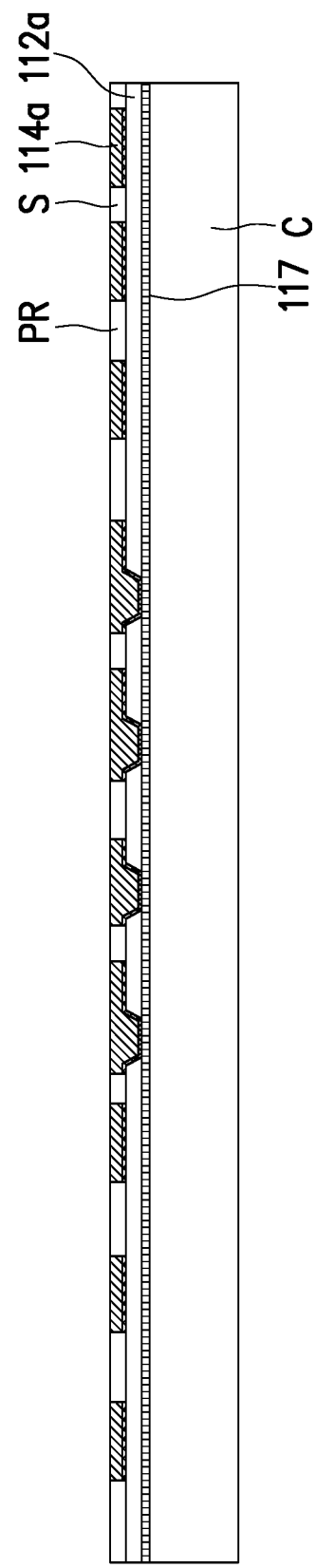
Figure 21:
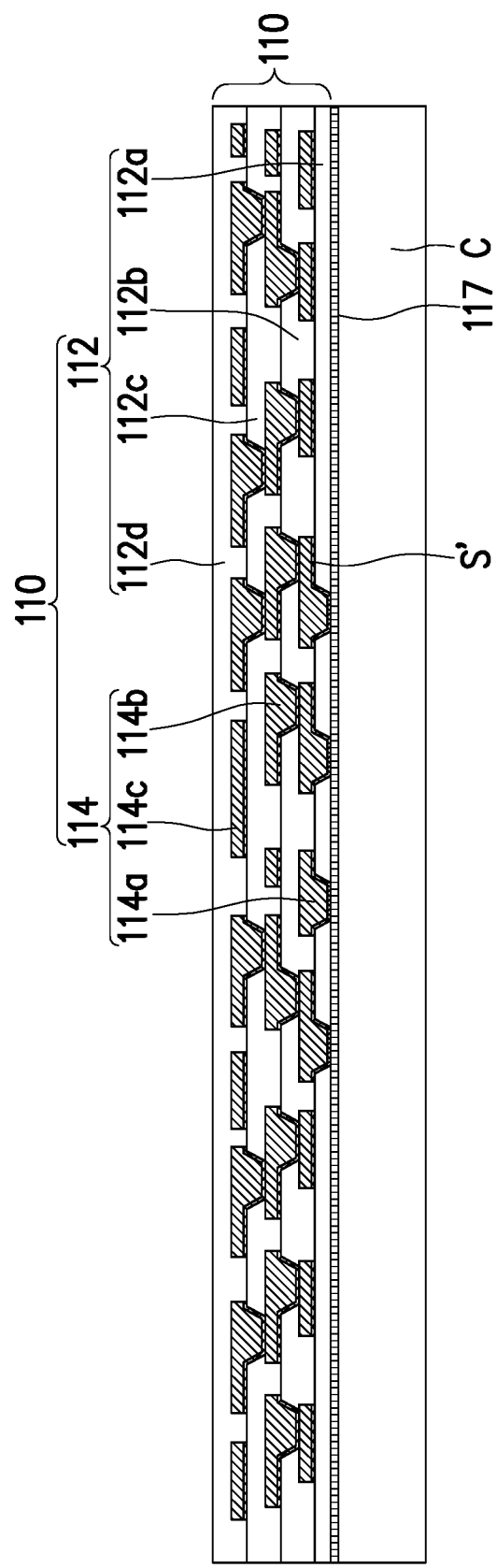
Figure 22:
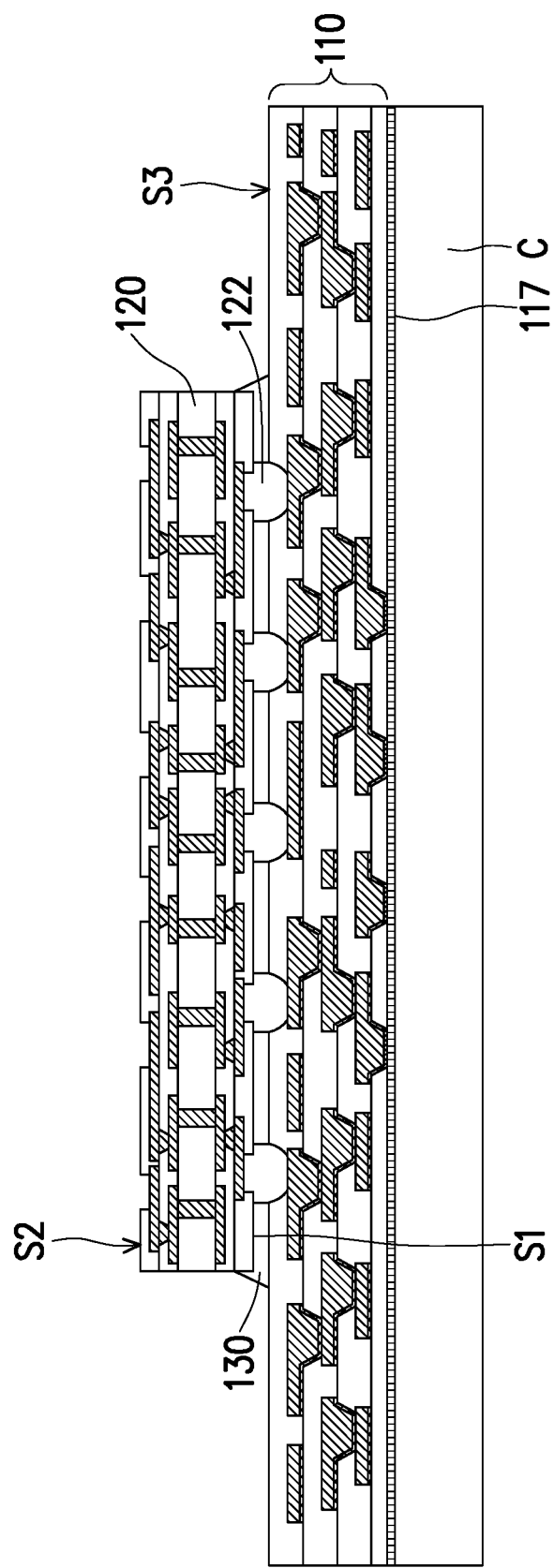
Figure 23:
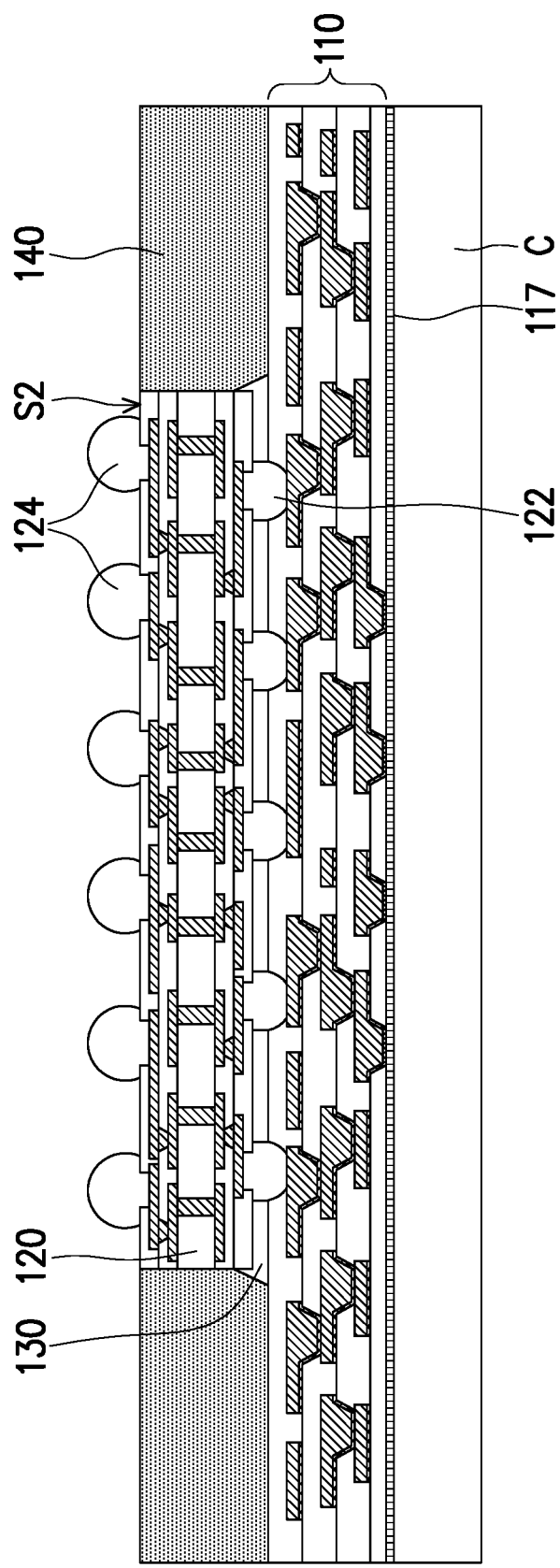
Figure 24:
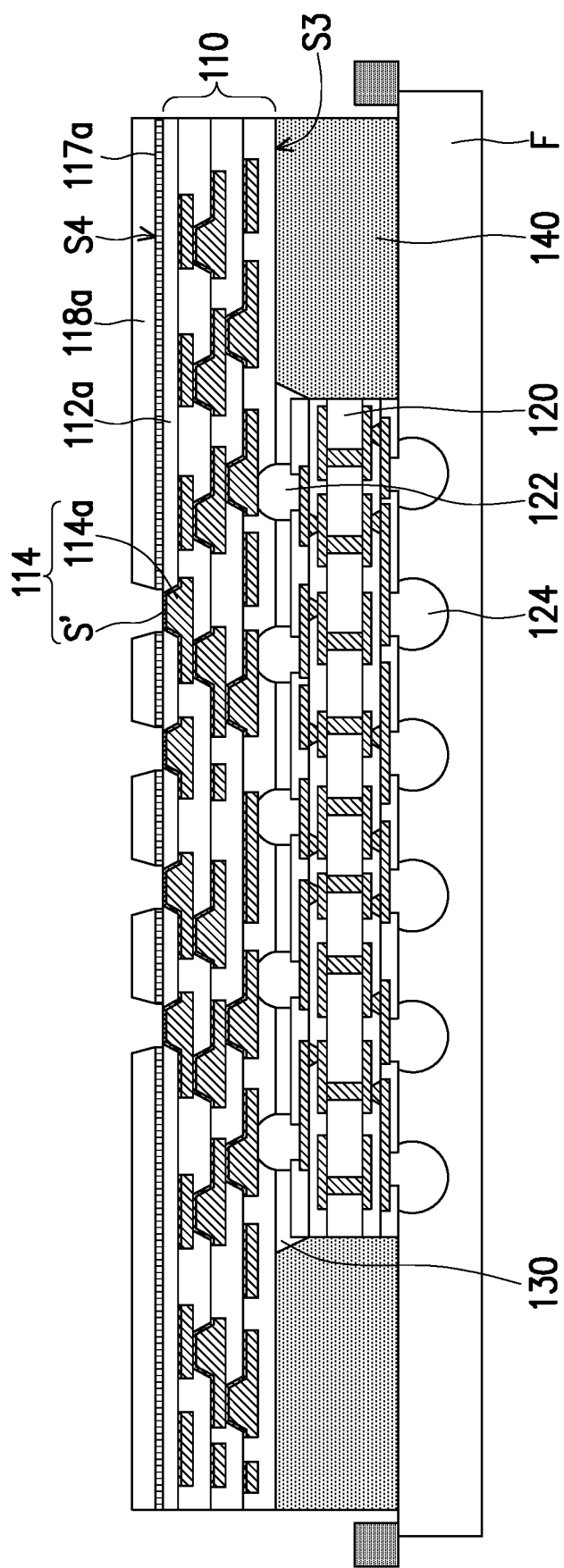
Figure 25:
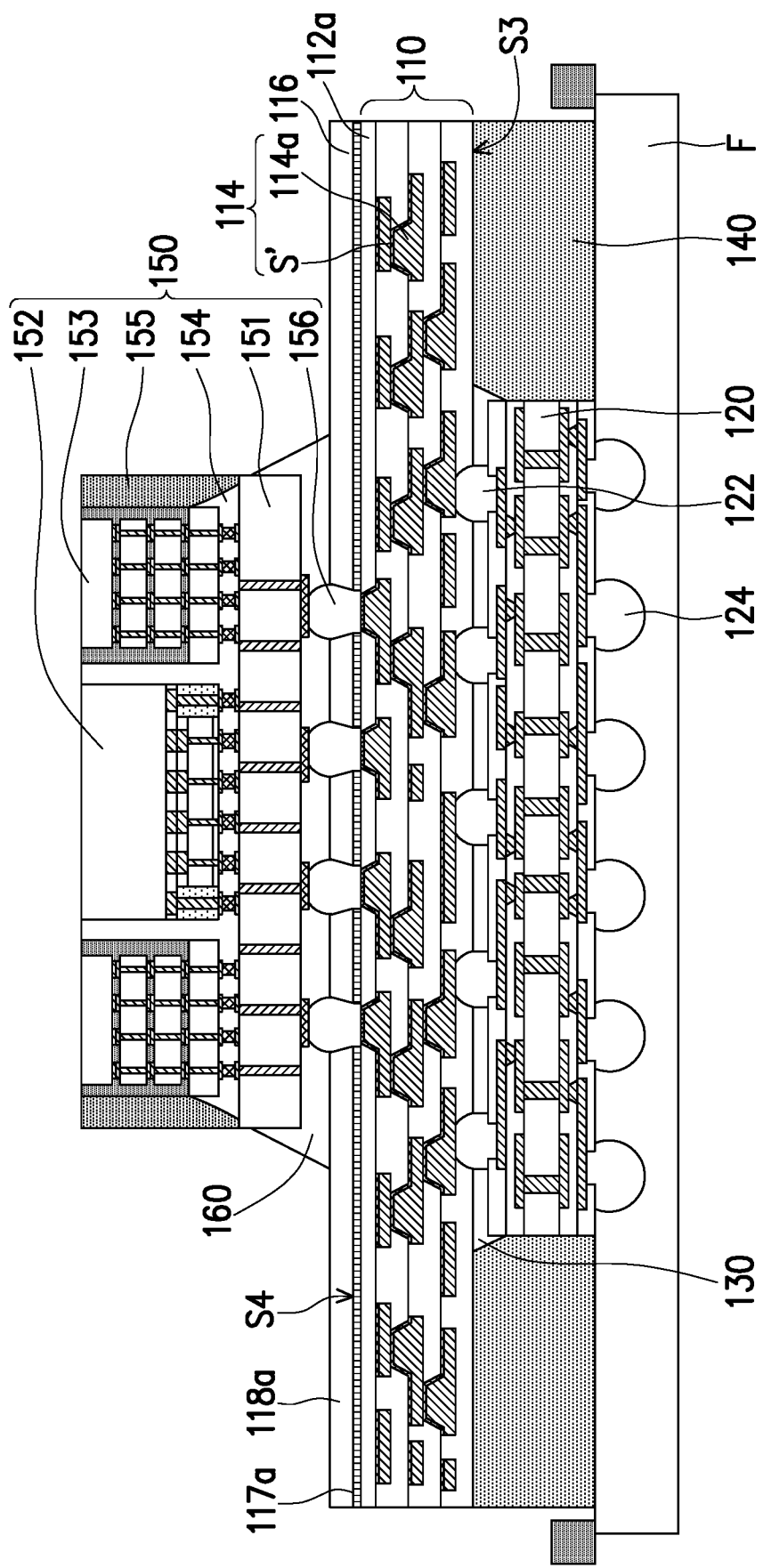
Figure 26:
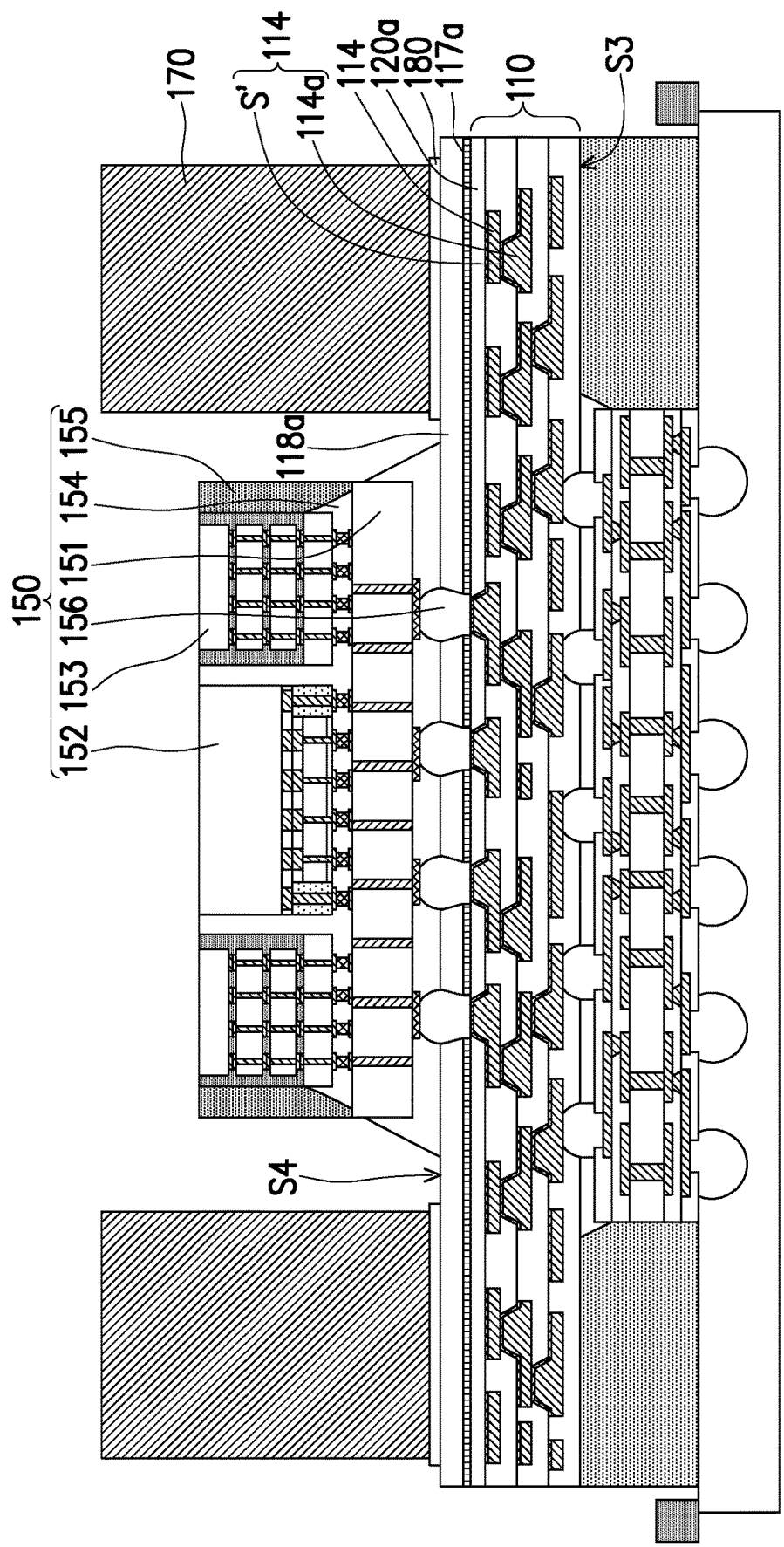
Figure 27:
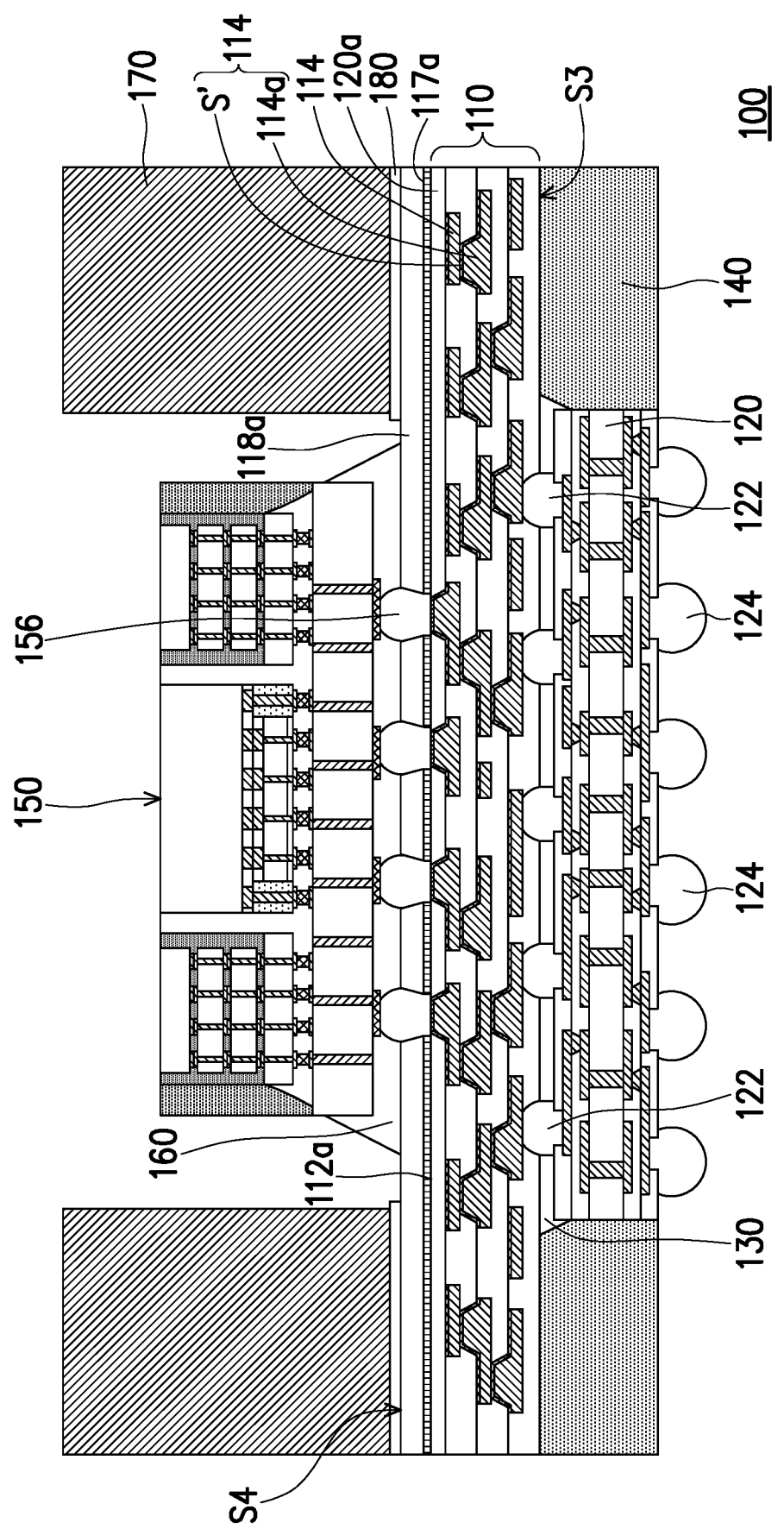

FIG. 14 through FIG. 18 are cross-sectional views schematically illustrating a process flow for fabricating a package structure in accordance with the third embodiment of the present disclosure. Processes illustrated in FIG. 14 through FIG. 18 are performed after the processes illustrated in FIG. 1 through FIG. 6. Processes illustrated in FIG. 16 through FIG. 18 are similar to those illustrated in FIG. 7 through FIG. 9, and descriptions regarding to the processes illustrated in FIG. 16 through FIG. 18 are thus omitted.

Referring to FIG. 6 and FIG. 14, after performing the de-bonding process and the frame mount process illustrated in FIG. 6, a barrier material layer 117 and a buffer material layer 118 are sequentially deposited over the redistribution circuit structure 110. The outermost dielectric layer 112a and the first conductive wirings 114a are covered by the barrier material layer 117 and the buffer material layer 118. As illustrated in FIG. 14, the barrier material layer 117 is deposited on the redistribution circuit structure 110, and the buffer material layer 118 is deposited on the barrier material layer 117. The barrier material layer 117 is sandwiched between the buffer material layer 118 and the redistribution circuit structure 110.

Referring to FIG. 14 and FIG. 15, a patterning process is performed to form a barrier layer 117a and a buffer material layer 118a such that the first conductive wirings 114a are revealed by openings defined in the barrier layer 117a and the buffer material layer 118a. In some embodiments, the material of the barrier layer 117a includes nickel (Ni), copper (Cu) and titanium (Ti), the material of the buffer layer 118a includes polymer. The thickness of the outermost dielectric layer 112a may range from about 5 micrometers to about 10 micrometers, the thickness of the barrier layer 117a may range from about 0.1 micrometers to about 0.5 micrometer, and the thickness of the buffer layer 118a may range from about 10 micrometers to about 50 micrometers. In some embodiments, the sum of the thickness of the outermost dielectric layer 112a, the barrier layer 117a and the buffer layer 118a may be greater than 30 micrometers. In some other embodiments, the sum of the thickness of the outermost dielectric layer 112a, the barrier layer 117a and the buffer layer 118a may range from about 5 micrometers to about 65 micrometers. In the present embodiments, the outermost dielectric layer 112a, the barrier layer 117a and the buffer layer 118a can provide sufficient barrier and/or buffering function. The outermost dielectric layer 112a, the barrier layer 117a and the buffer layer 118a may prevent chemical diffusion from the adhesive 180. The chemical diffusion from the adhesive 180 may be blocked by the outermost dielectric layer 112a, the barrier layer 117a and the buffer layer 118a. Furthermore, an interface between the first dielectric layer 112a and the first conductive wirings 114a may not be damage by the chemical diffusion from the adhesive 180. Accordingly, delamination issue may not occur at the interface between the first dielectric layer 112a and the first conductive wirings 114a, and reliability of the redistribution circuit structure 110 may be improved. In some embodiments, as illustrated in FIG. 16, the first conductive terminals 156 penetrate through the barrier layer 117a, the buffer layer 118a and the outermost dielectric layer 112a of the redistribution circuit structure 110 to electrically connect to redistribution wirings 114a of the redistribution circuit structure 110.

FIG. 19 through FIG. 27 are cross-sectional views schematically illustrating a process flow for fabricating a package structure in accordance with the fourth embodiments of the present disclosure.

Referring to FIG. 19 through FIG. 23, the processes illustrated in FIG. 19 through 23 are similar to the processes illustrated in FIG. 1 through FIG. 5 except that a barrier material layer 117 is formed over the carrier C prior to the formation of the first dielectric layer 112a. In some embodiments, the barrier material layer 117 is formed over the carrier C through a sputter process or other suitable deposition process.

Referring to FIG. 24 through FIG. 27, the processes illustrated in FIG. 24 through 27 are similar to the processes illustrated in FIG. 10 through FIG. 13 except that the barrier material layer 117a and the buffer layer 118a are simultaneously formed over the redistribution circuit structure 110 through a patterning process (e.g., an etch process) after performing the de-bonding process and the frame mount process illustrated in FIG. 6.

FIG. 28 through FIG. 35 are cross-sectional views schematically illustrating a process flow for fabricating a package structure in accordance with the fifth embodiments of the present disclosure.

Figure 28:
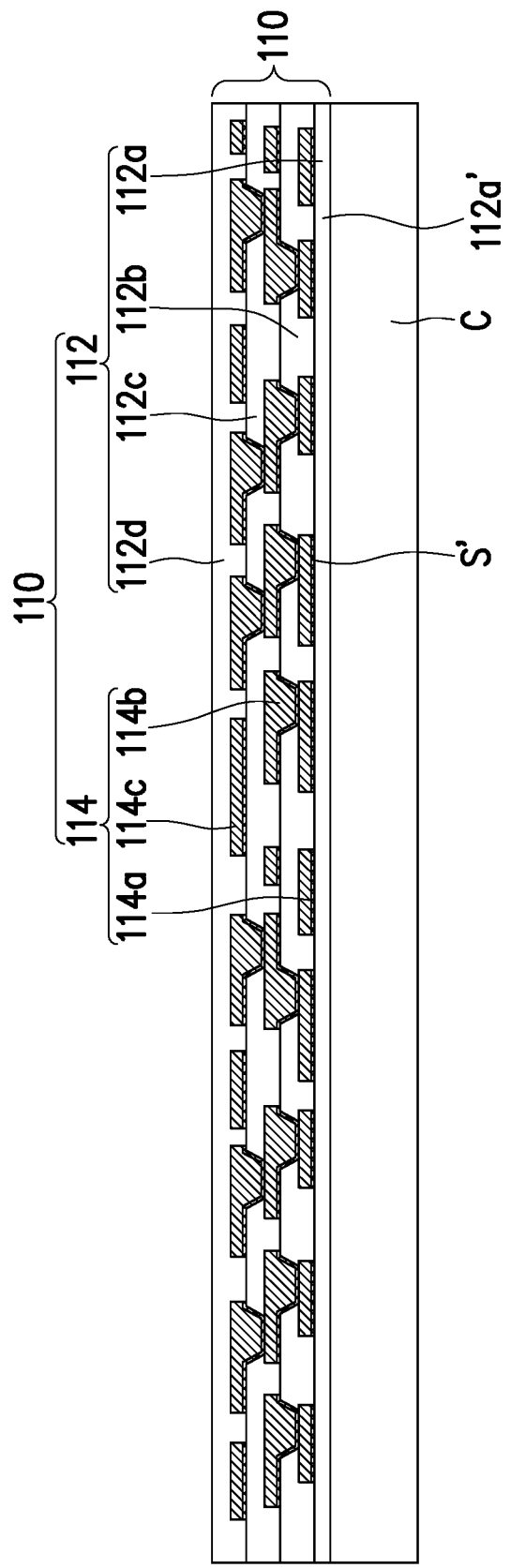
FIG. 28 through FIG. 35 are cross-sectional views schematically illustrating a process flow for fabricating a package structure in accordance with the fifth embodiments of the present disclosure.

Referring to FIG. 28, a carrier C is provided and a redistribution circuit structure 110 is formed over the carrier C. In some embodiments, the wafer form redistribution circuit structure 110 is formed over a wafer form carrier C. The redistribution circuit structure 110 may include stacked dielectric layers 112 and redistribution wirings 114 between the stacked dielectric layers 112. The stacked dielectric layers 112 are stacked over the carrier C. The redistribution wirings 114 are embedded in the stacked dielectric layers 112 carried by the carrier C.

As illustrated in FIG. 28, a first dielectric layer 112a' is formed over the carrier C. The first dielectric layer 112a' entirely cover the carrier C and no opening is defined in the first dielectric layer 112a'. In some embodiments, the material of the first dielectric layer 112a' includes polybenzoxazole (PBO), polyimide (PI) or other suitable polymer dielectric material. In some alternative embodiments, the material of the dielectric layer 112a' includes resin mixed with filler.

Figure 29:
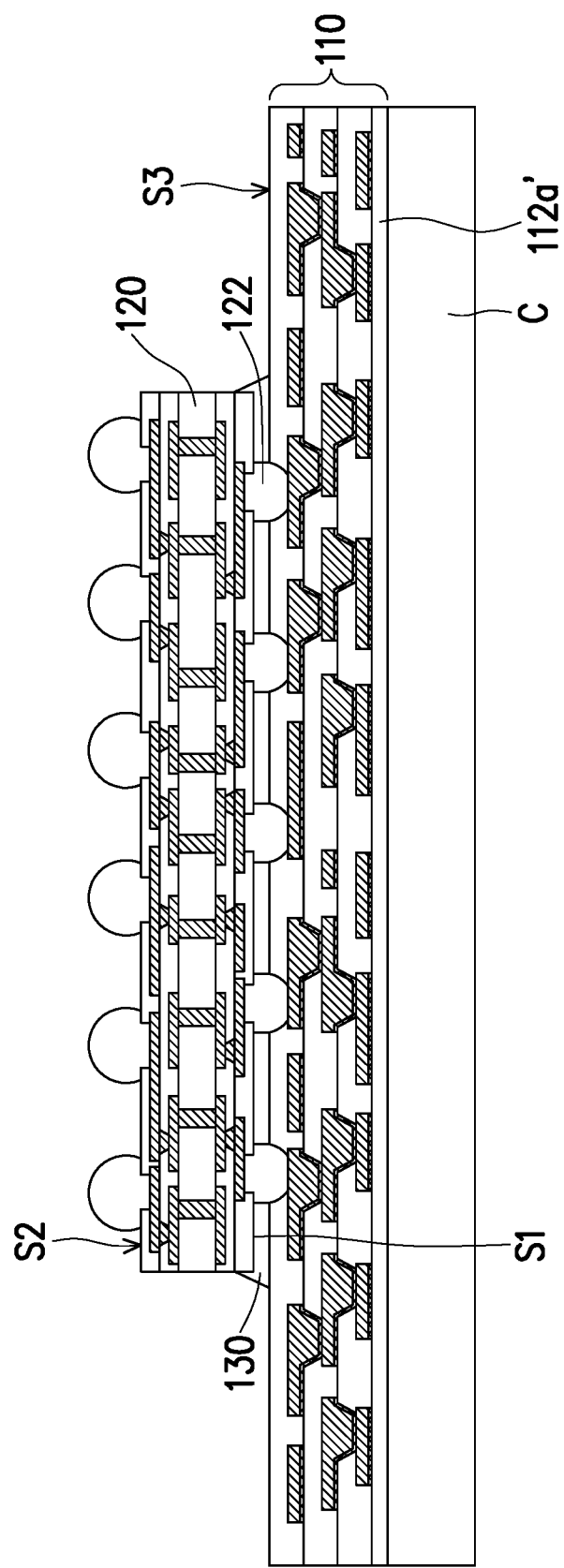
Figure 30:
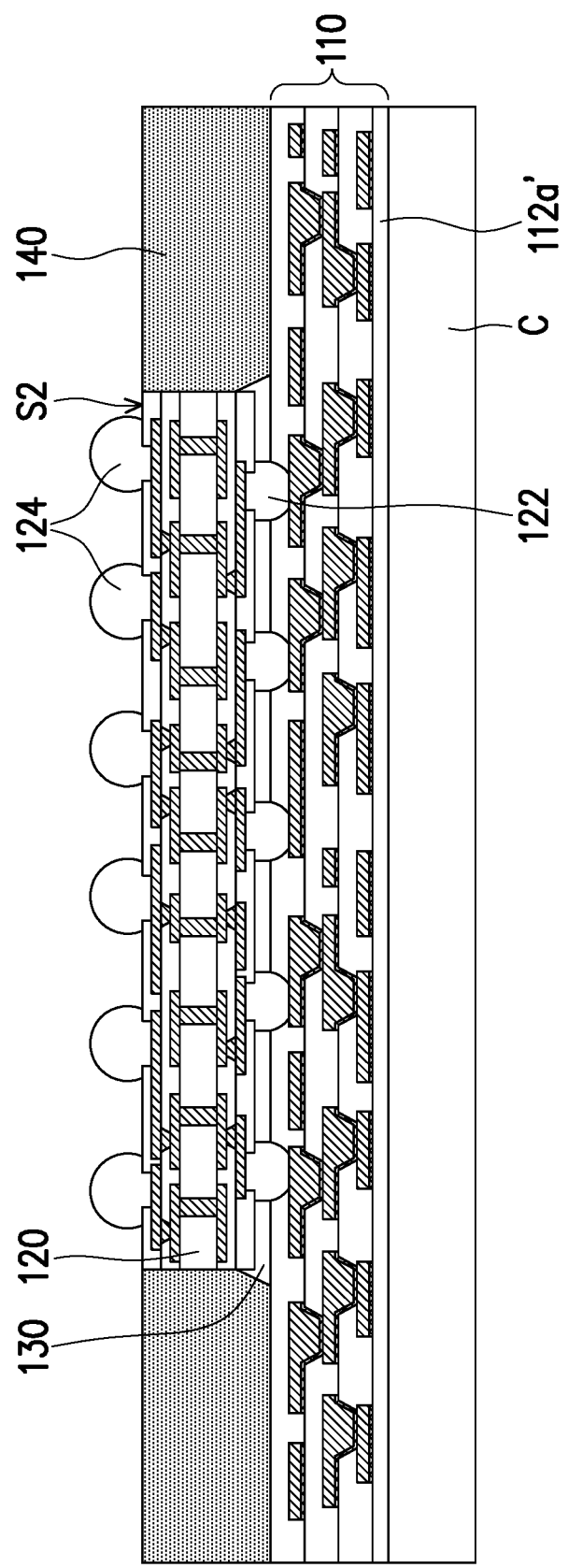
Figure 31:
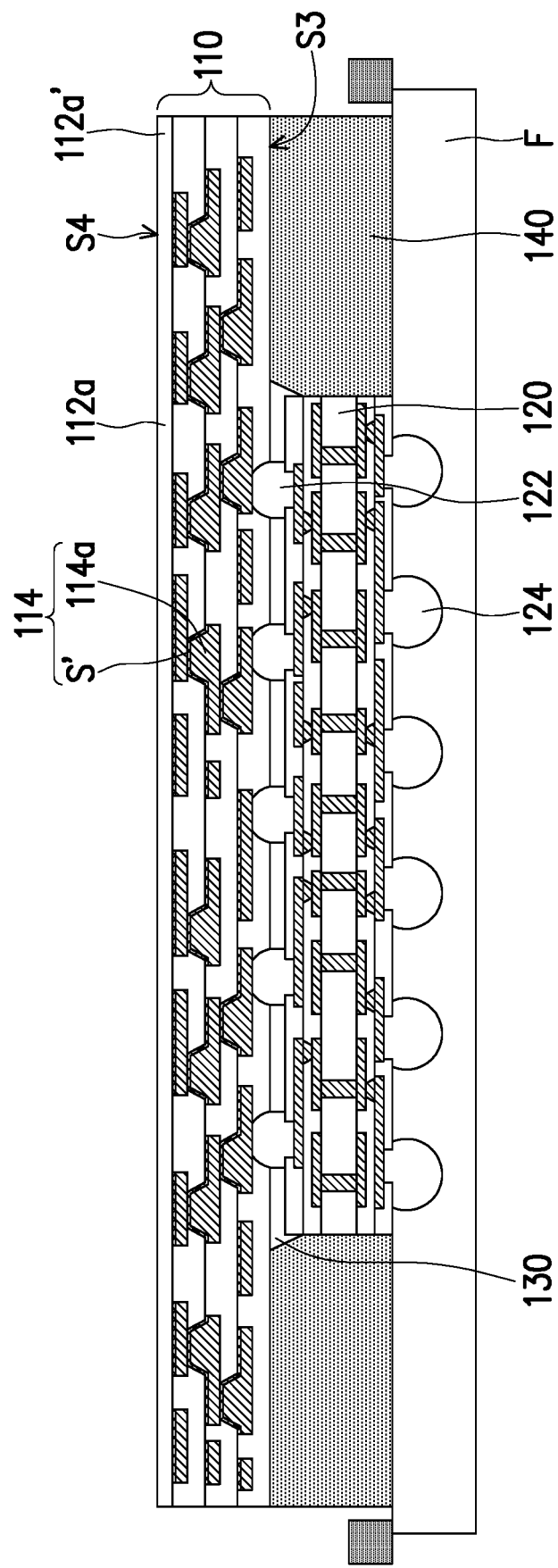
Figure 32:
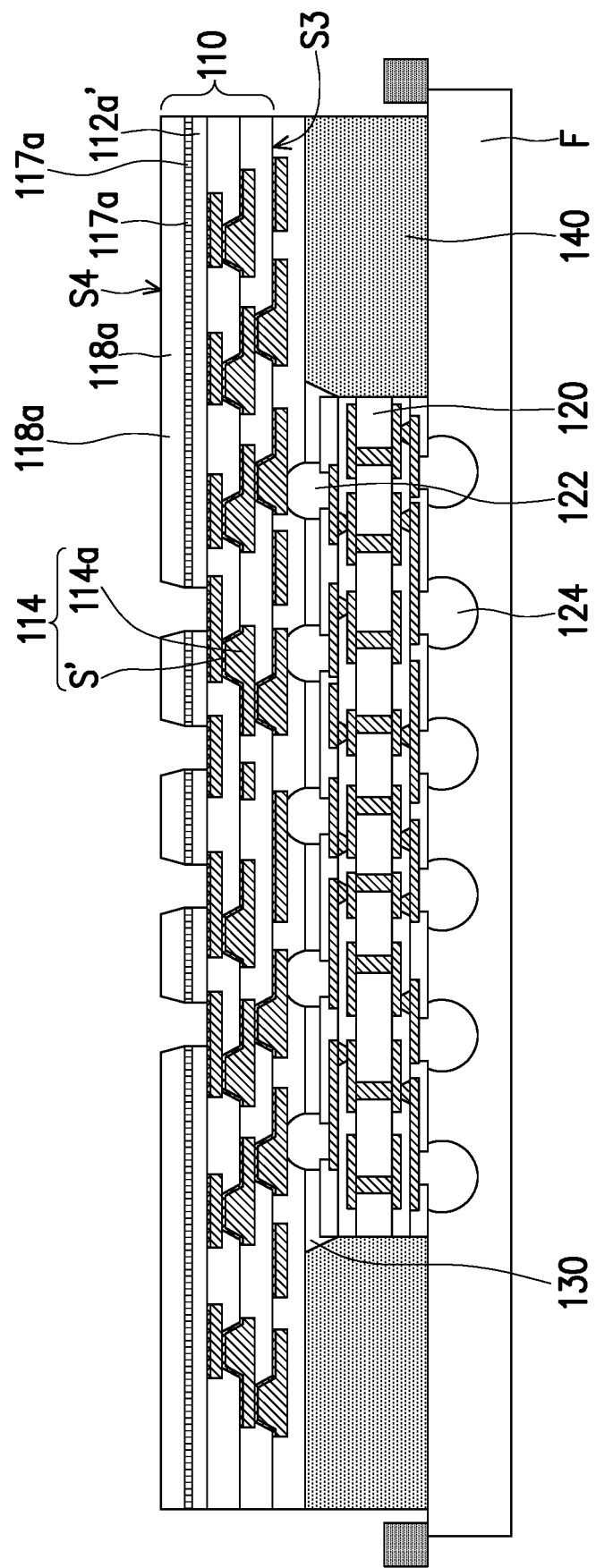
Figure 33:
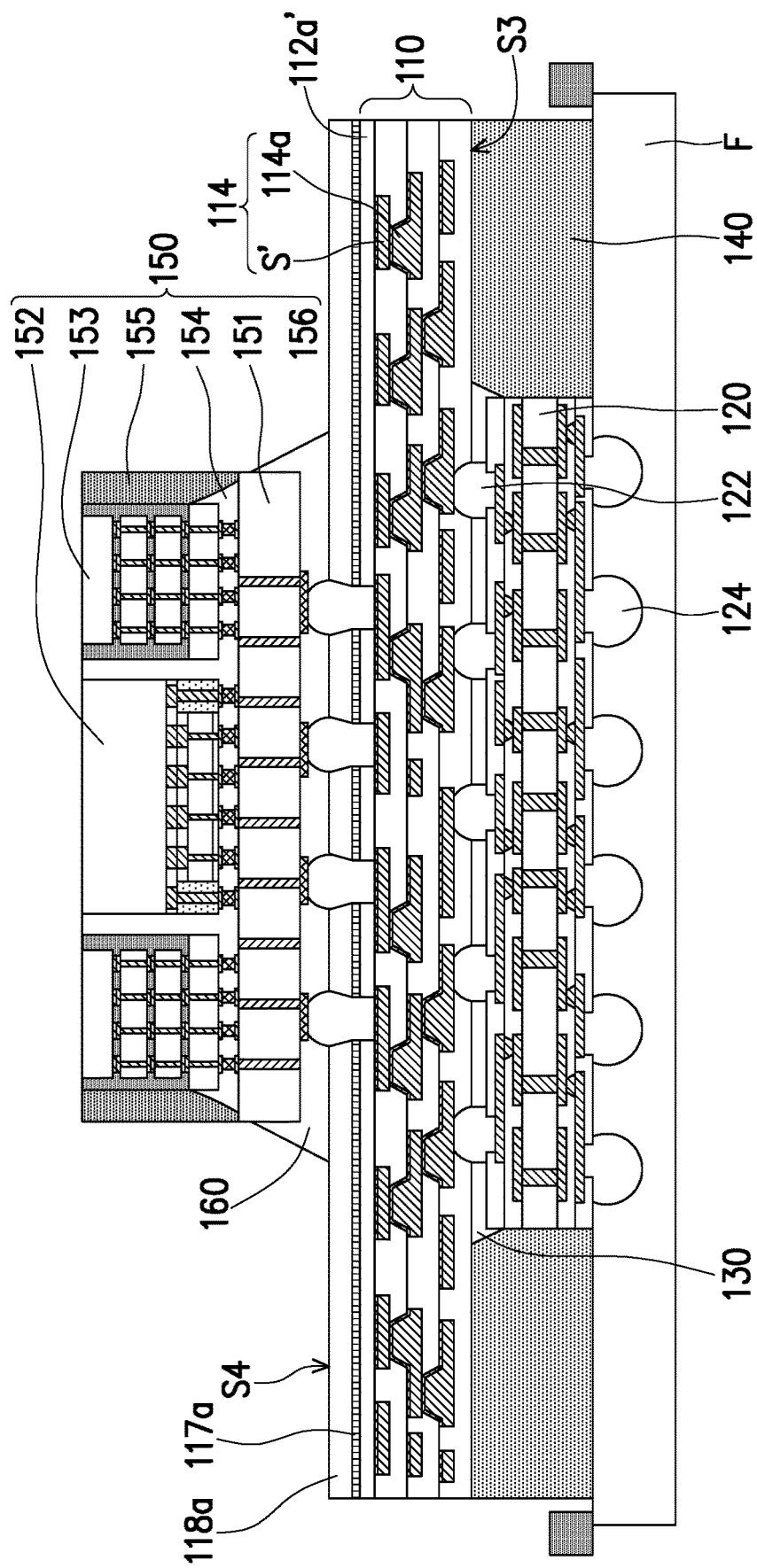
Figure 34:
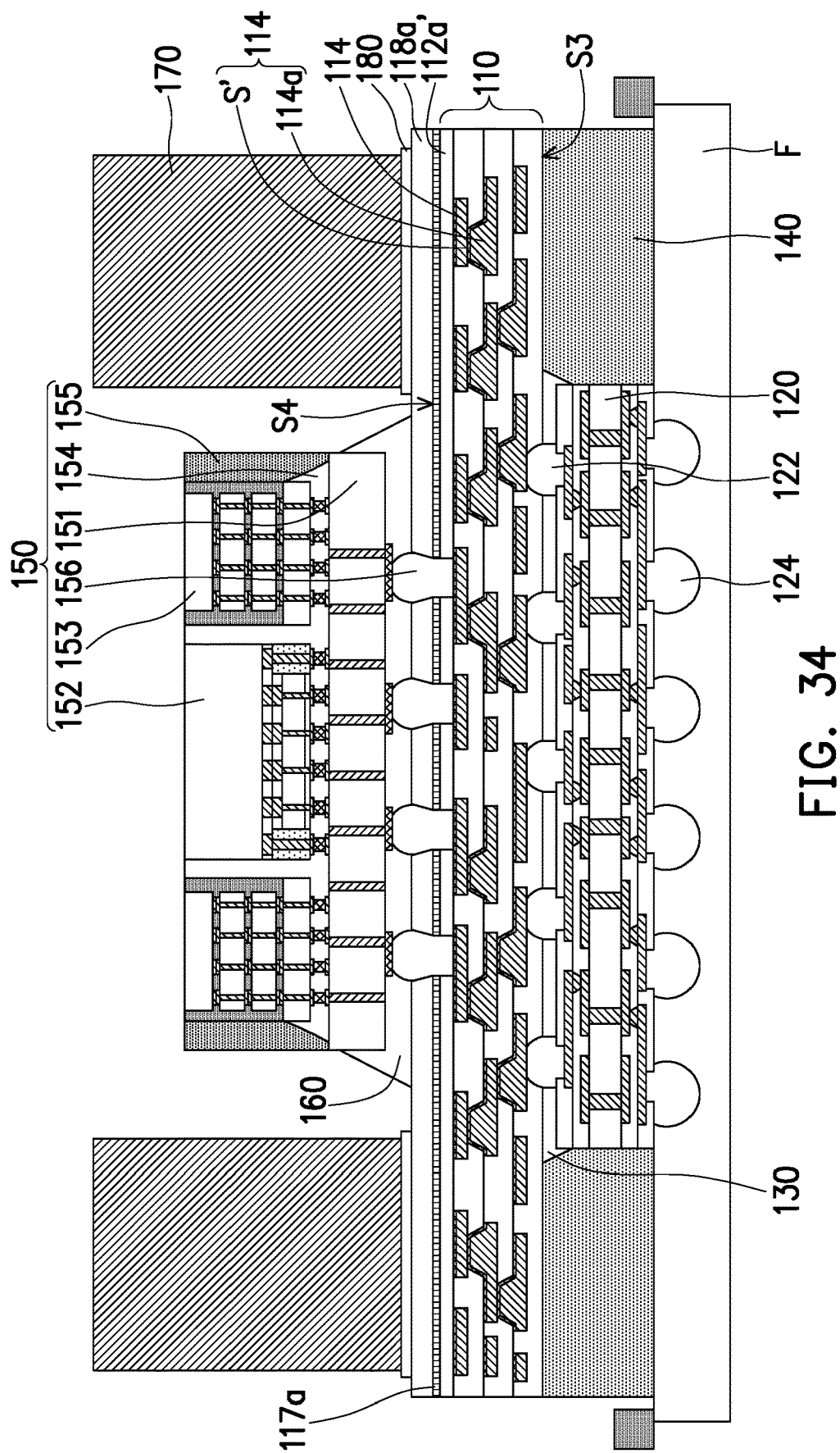

Processes illustrated in FIG. 29 through FIG. 31 are similar to those illustrated in FIG. 3 through FIG. 6, and descriptions regarding to the processes illustrated in FIG. 29 through FIG. 31 are thus omitted.

Processes illustrated in FIG. 32 through FIG. 35 are similar to those illustrated in FIG. 15 through FIG. 18, and descriptions regarding to the processes illustrated in FIG. 32 through FIG. 35 are thus omitted.

Figure 36:
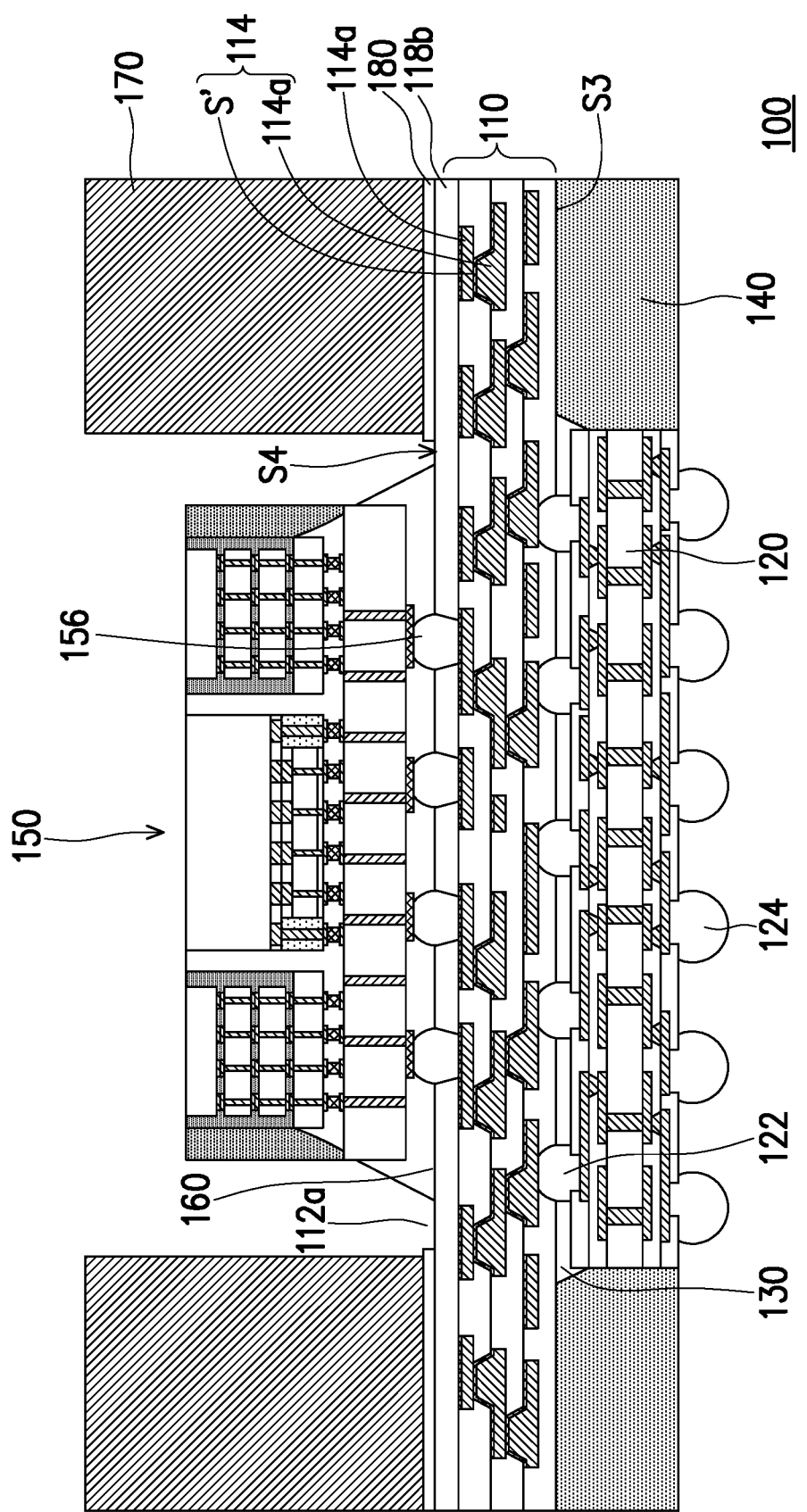
FIG. 36 is a cross-sectional view schematically illustrating a package structure in accordance with some other embodiments of the present disclosure.

FIG. 36 is a cross-sectional view schematically illustrating a package structure in accordance with some other embodiments of the present disclosure.

Figure 35:
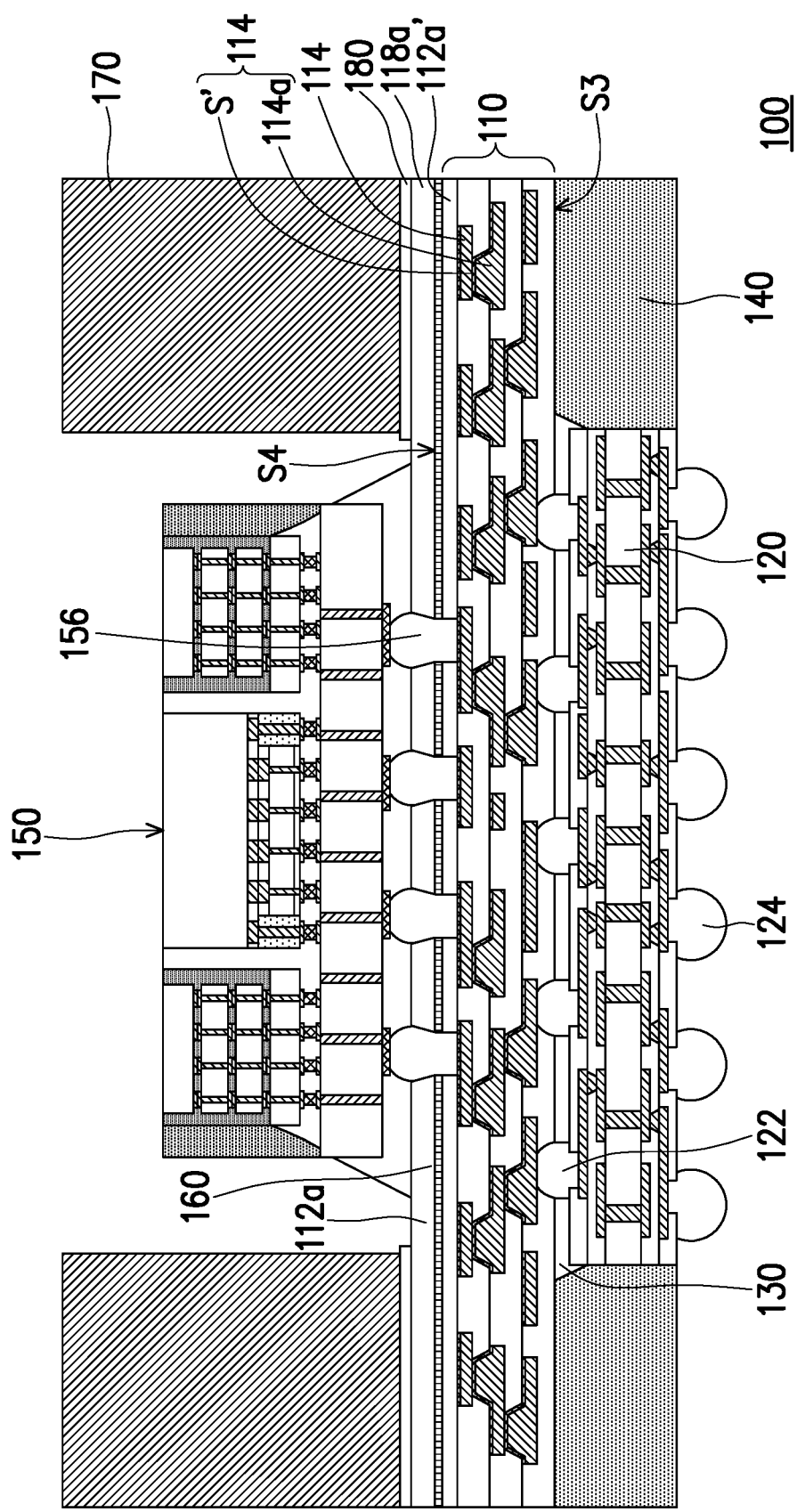

Referring to FIG. 35 and FIG. 36, the package structure illustrated in FIG. 36 is similar to the package structure illustrated in FIG. 35 except that only a buffer layer 118b is between the conductive wirings 114a and the adhesive 180, and the conductive terminals 156 penetrate through the buffer layer 118b to electrically connected to the conductive wirings 114a.

Figure 37:
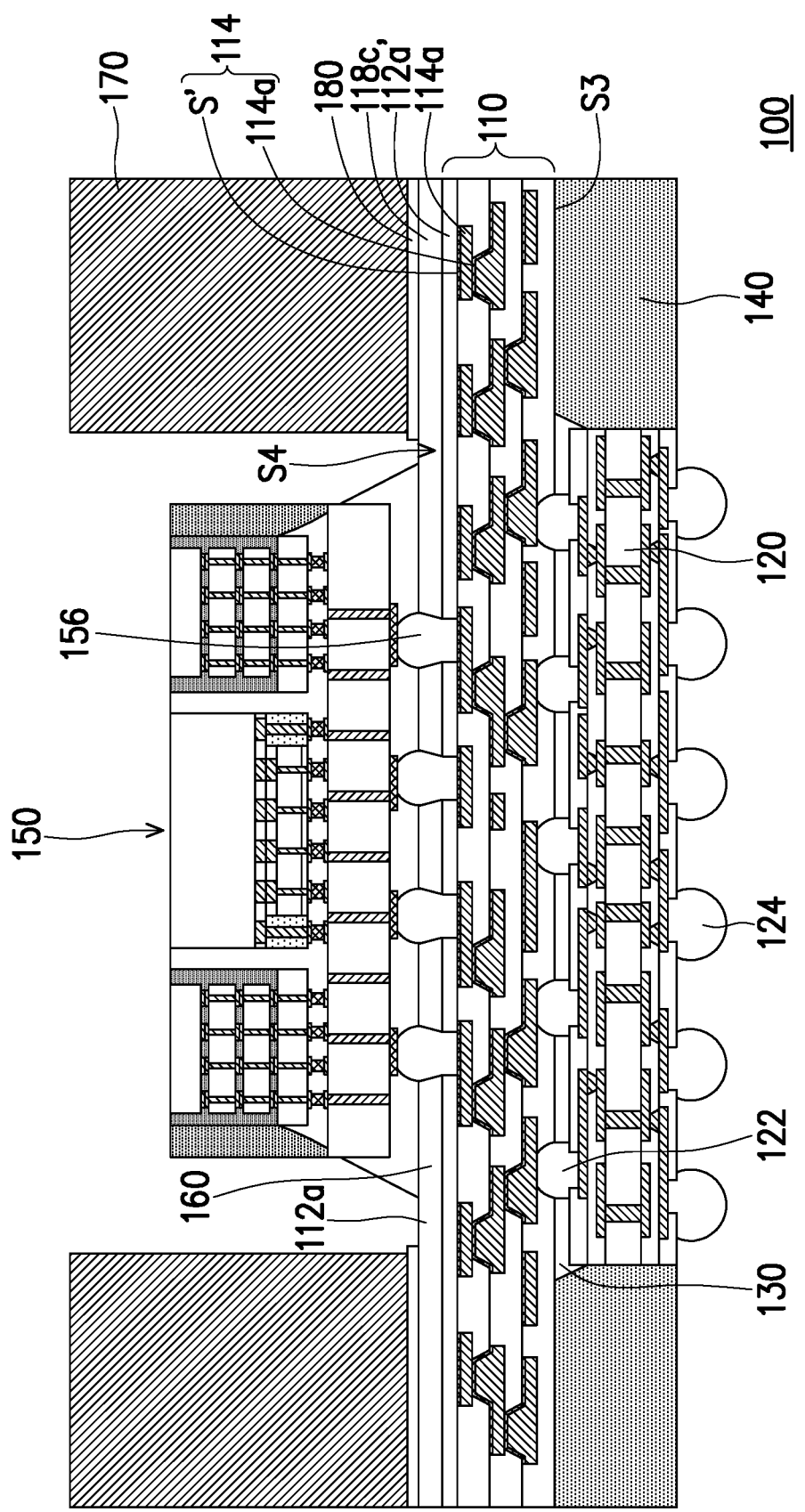
FIG. 37 is a cross-sectional view schematically illustrating a package structure in accordance with some alternative embodiments of the present disclosure.

FIG. 37 is a cross-sectional view schematically illustrating a package structure in accordance with some alternative embodiments of the present disclosure.

Referring to FIG. 35 and FIG. 37, the package structure illustrated in FIG. 37 is similar to the package structure illustrated in FIG. 35 except that only a buffer layer 118b and a first dielectric layer 112a' are formed between the conductive wirings 114a and the adhesive 180, and the conductive terminals 156 penetrate through the buffer layer 118b and the first dielectric layer 112a' to electrically connected to the conductive wirings 114a.

In the above-mentioned embodiments, the first dielectric layer 112a, the first dielectric layer 112a', the buffer layer 116, the barrier layer 117, the barrier layer 117a, and the buffer layers 118a-118c or combinations thereof may serve as a block layer for preventing chemical diffusion from the adhesive 180. Accordingly, reliability of package structures may be improved.

In accordance with some embodiments of the disclosure, a package structure including a redistribution circuit structure, a wiring substrate, an insulating encapsulation, a buffer layer, a semiconductor device and a stiffener ring is provided. The redistribution circuit structure includes a first surface and a second surface opposite to the first surface. The wiring substrate is disposed on the first surface of the redistribution circuit structure. The insulating encapsulation is disposed on the first surface of the redistribution circuit structure and laterally encapsulating the wiring substrate. The buffer layer is disposed over the second surface of the redistribution circuit structure. The semiconductor device is disposed on the buffer layer, and the semiconductor device is electrically connected to the wiring substrate through the redistribution circuit structure. The stiffener ring is adhered with the buffer layer by an adhesive. In some embodiments, the package structure further includes a barrier layer disposed on the second surface of the redistribution circuit structure, wherein the barrier layer is disposed between the buffer layer and the redistribution circuit structure. In some embodiments, the package structure further includes first conductive terminals and a first underfill, wherein the first conductive terminals are disposed between the redistribution circuit structure and the semiconductor device, the redistribution circuit structure is electrically connected to the semiconductor device through the first conductive terminals, the first underfill is disposed between the redistribution circuit structure and the semiconductor device, and the first underfill laterally encapsulates the first conductive terminals. In some embodiments, the first conductive terminals penetrate through the buffer layer to electrically connect to redistribution wirings of the redistribution circuit structure. In some embodiments, the first conductive terminals penetrate through the buffer layer and an outermost dielectric layer of the redistribution circuit structure to electrically connect to redistribution wirings of the redistribution circuit structure. In some embodiments, the package structure further includes first conductive terminals and a barrier layer, wherein the first conductive terminals are disposed between the redistribution circuit structure and the semiconductor device, the redistribution circuit structure is electrically connected to the semiconductor device through the first conductive terminals, the barrier layer is disposed on the second surface of the redistribution circuit structure, and the barrier layer is disposed between the buffer layer and the redistribution circuit structure. In some embodiments, the first conductive terminals penetrate through the buffer layer and the barrier layer to electrically connected to redistribution wirings of the redistribution circuit structure. In some embodiments, the first conductive terminals penetrate through the buffer layer, the barrier layer and an outermost dielectric layer of the redistribution circuit structure to electrically connected to redistribution wirings of the redistribution circuit structure. In some embodiments, the package structure further includes second conductive terminals and a second underfill, wherein the a second conductive terminals are disposed between the redistribution circuit structure and the wiring substrate, the redistribution circuit structure is electrically connected to the wiring substrate through the second conductive terminals, the second underfill is disposed between the redistribution circuit structure and the wiring substrate, and the second underfill laterally encapsulates the second conductive terminals. In some embodiments, the package structure further includes third conductive terminals electrically connected to the wiring substrate, wherein the second conductive terminals and the third conductive terminals are disposed on opposite surfaces of the wiring substrate.

In accordance with some other embodiments of the disclosure, a package structure including a redistribution circuit structure, a wiring substrate, an insulating encapsulation, a semiconductor device and a stiffener ring is provided. The redistribution circuit structure includes a first surface and a second surface opposite to the first surface. The wiring substrate is disposed on the first surface of the redistribution circuit structure. The insulating encapsulation is disposed on the first surface of the redistribution circuit structure and laterally encapsulating the wiring substrate. The semiconductor device is disposed on the second surface of the redistribution circuit structure, and the semiconductor device is electrically connected to the wiring substrate through the redistribution circuit structure. The stiffener ring is adhered with the second surface of the redistribution circuit structure by an adhesive, wherein the stiffener ring is adhered with an outermost dielectric layer of the redistribution circuit structure by the adhesive, and a thickness of the outermost dielectric layer of the redistribution circuit structure is greater than 7 micrometers. In some embodiments, the package structure further includes a buffer layer disposed over the outermost dielectric layer of the redistribution circuit structure, wherein the buffer layer is disposed between the redistribution circuit structure and the semiconductor device. In some embodiments, the package structure further includes a barrier layer disposed on the outermost dielectric layer of the redistribution circuit structure, wherein the barrier layer is disposed between the buffer layer and the redistribution circuit structure. In some embodiments, the package structure further includes first conductive terminals and a first underfill, wherein the first conductive terminals are disposed between the redistribution circuit structure and the semiconductor device, the redistribution circuit structure is electrically connected to the semiconductor device through the first conductive terminals, the first underfill is disposed between the redistribution circuit structure and the semiconductor device, and the first underfill laterally encapsulates the first conductive terminals. In some embodiments, the first conductive terminals penetrate through the buffer layer and the outermost dielectric layer of the redistribution circuit structure to electrically connect to redistribution wirings of the redistribution circuit structure. In some embodiments, the package structure further includes second conductive terminals and a second underfill, wherein the second conductive terminals are disposed between the redistribution circuit structure and the wiring substrate, the redistribution circuit structure is electrically connected to the wiring substrate through the second conductive terminals, the second underfill is disposed between the redistribution circuit structure and the wiring substrate, and the second underfill laterally encapsulates the second conductive terminals.

In accordance with some other embodiments of the disclosure, a method is provided. A wiring substrate is mounted over a first surface of a redistribution circuit structure. The wiring substrate is laterally encapsulated with an insulating encapsulation. A buffer layer is formed over a second surface of the redistribution circuit structure. A semiconductor device is mounted over buffer layer, wherein the semiconductor device is electrically connected to the wiring substrate through the redistribution circuit structure. A stiffener ring is adhered with the buffer layer by an adhesive. In some embodiments, the redistribution circuit structure is formed over a carrier. In some embodiments, the method further includes: before forming the redistribution circuit structure over the carrier, forming a barrier layer on the carrier. In some embodiments, the method further includes: de-bonding the redistribution circuit structure from the carrier to reveal the second surface of the redistribution circuit structure; and forming a barrier layer on the revealed second surface of the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a redistribution circuit structure comprising a first surface and a second surface opposite to the first surface;
    a wiring substrate disposed on the first surface of the redistribution circuit structure;
    an insulating encapsulation disposed on the first surface of the redistribution circuit structure and laterally encapsulating the wiring substrate;
    a buffer layer disposed over the second surface of the redistribution circuit structure;
    a semiconductor device disposed on the buffer layer, and the semiconductor device being electrically connected to the wiring substrate through the redistribution circuit structure, wherein the buffer layer is between the wiring substrate and the semiconductor device; and
    a stiffener ring adhered with the buffer layer by an adhesive.

2. The package structure as claimed in claim 1 further comprising a barrier layer disposed on the second surface of the redistribution circuit structure, wherein the barrier layer is disposed between the buffer layer and the redistribution circuit structure.

3. The package structure as claimed in claim 1 further comprising:
    first conductive terminals disposed between the redistribution circuit structure and the semiconductor device, wherein the redistribution circuit structure is electrically connected to the semiconductor device through the first conductive terminals; and
    a first underfill disposed between the redistribution circuit structure and the semiconductor device and laterally encapsulating the first conductive terminals.

4. The package structure as claimed in claim 3, wherein the first conductive terminals penetrate through the buffer layer to electrically connect to redistribution wirings of the redistribution circuit structure.

5. The package structure as claimed in claim 3, wherein the first conductive terminals penetrate through the buffer layer and an outermost dielectric layer of the redistribution circuit structure to electrically connect to redistribution wirings of the redistribution circuit structure.

6. The package structure as claimed in claim 1 further comprising:
    first conductive terminals disposed between the redistribution circuit structure and the semiconductor device, wherein the redistribution circuit structure is electrically connected to the semiconductor device through the first conductive terminals; and
    a barrier layer disposed on the second surface of the redistribution circuit structure, wherein the barrier layer is disposed between the buffer layer and the redistribution circuit structure.

7. The package structure as claimed in claim 6, wherein the first conductive terminals penetrate through the buffer layer and the barrier layer to electrically connected to redistribution wirings of the redistribution circuit structure.

8. The package structure as claimed in claim 6, wherein the first conductive terminals penetrate through the buffer layer, the barrier layer and an outermost dielectric layer of the redistribution circuit structure to electrically connected to redistribution wirings of the redistribution circuit structure.

9. The package structure as claimed in claim 1 further comprising:
    second conductive terminals disposed between the redistribution circuit structure and the wiring substrate, wherein the redistribution circuit structure is electrically connected to the wiring substrate through the second conductive terminals; and a second underfill disposed between the redistribution circuit structure and the wiring substrate and laterally encapsulating the first conductive terminals.

10. The package structure as claimed in claim 9 further comprising:

third conductive terminals electrically connected to the wiring substrate, wherein the second conductive terminals and the third conductive terminals are disposed on opposite surfaces of the wiring substrate.

11. A package structure, comprising:

a redistribution circuit structure comprising a first surface and a second surface opposite to the first surface;

a wiring substrate disposed on the first surface of the redistribution circuit structure;

an insulating encapsulation disposed on the first surface of the redistribution circuit structure and laterally encapsulating the wiring substrate;

a semiconductor device disposed on the second surface of the redistribution circuit structure, wherein the semiconductor device is electrically connected to the wiring substrate through the redistribution circuit structure;

a stiffener ring adhered with the second surface of the redistribution circuit structure by an adhesive, wherein the stiffener ring is adhered with an outermost dielectric layer of the redistribution circuit structure by the adhesive; and a buffer layer disposed over the outermost dielectric layer of the redistribution circuit structure, wherein the buffer layer is between the wiring substrate and the semiconductor device.

12. The package structure as claimed in claim 11, wherein a thickness of the outermost dielectric layer of the redistribution circuit structure is greater than 7 micrometers.

13. The package structure as claimed in claim 11 further comprising a barrier layer disposed on the outermost dielectric layer of the redistribution circuit structure, wherein the barrier layer is disposed between the buffer layer and the redistribution circuit structure.

14. The package structure as claimed in claim 11 further comprising:

first conductive terminals disposed between the redistribution circuit structure and the semiconductor device, wherein the redistribution circuit structure is electrically connected to the semiconductor device through the first conductive terminals; and a first underfill disposed between the redistribution circuit structure and the semiconductor device and laterally encapsulating the first conductive terminals.

15. The package structure as claimed in claim 14, wherein the first conductive terminals penetrate through the buffer layer and the outermost dielectric layer of the redistribution circuit structure to electrically connect to redistribution wirings of the redistribution circuit structure.

16. The package structure as claimed in claim 11 further comprising:

second conductive terminals disposed between the redistribution circuit structure and the wiring substrate, wherein the redistribution circuit structure is electrically connected to the wiring substrate through the second conductive terminals; and a second underfill disposed between the redistribution circuit structure and the wiring substrate and laterally encapsulating the second conductive terminals.

17. A method, comprising:

mounting a wiring substrate over a first surface of a redistribution circuit structure;

laterally encapsulating the wiring substrate with an insulating encapsulation;

forming a buffer layer over a second surface of the redistribution circuit structure;

mounting a semiconductor device over a buffer layer such that the buffer layer is between the wiring substrate and the semiconductor device, wherein the semiconductor device is electrically connected to the wiring substrate through the redistribution circuit structure; and adhering a stiffener ring with the buffer layer by an adhesive.

18. The method as claimed in claim 17, wherein the redistribution circuit structure is formed over a carrier.

19. The method as claimed in claim 18 further comprising:

before forming the redistribution circuit structure over the carrier, forming a barrier layer on the carrier.

20. The method as claimed in claim 18 further comprising:

de-bonding the redistribution circuit structure from the carrier to reveal the second surface of the redistribution circuit structure; and forming a barrier layer on the revealed second surface of the redistribution circuit structure.

* * * * *